(12) United States Patent
Deng et al.

(10) Patent No.: US 12,147,135 B2
(45) Date of Patent: Nov. 19, 2024

(54) DISPLAY SUBSTRATE, DISPLAY APPARATUS, AND LOAD COMPENSATION METHOD APPLIED TO DISPLAY SUBSTRATE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yin Deng, Beijing (CN); Bo Wu, Beijing (CN); Haohao Li, Beijing (CN); Ze Zhao, Beijing (CN); Zheng Liao, Beijing (CN); Yongju Yang, Beijing (CN)

(73) Assignees: Beijing BOE Technology Development Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 18/044,979

(22) PCT Filed: Jun. 30, 2022

(86) PCT No.: PCT/CN2022/102972
§ 371 (c)(1),
(2) Date: Mar. 10, 2023

(87) PCT Pub. No.: WO2024/000467
PCT Pub. Date: Jan. 4, 2024

(65) Prior Publication Data
US 2024/0295785 A1 Sep. 5, 2024

(51) Int. Cl.
*G02F 1/1362* (2006.01)
*G09G 3/36* (2006.01)

(52) U.S. Cl.
CPC .. *G02F 1/136286* (2013.01); *G02F 1/136204* (2013.01); *G09G 3/3648* (2013.01);
(Continued)

(58) Field of Classification Search
CPC ........ G02F 1/136286; G02F 1/136204; G09G 3/3648; G09G 3/3696; G09G 2300/0426; G09G 2300/043; G09G 2330/04
See application file for complete search history.

(56) References Cited

U.S. PATENT DOCUMENTS 10,347,659 B2 * 7/2019 Xi ...................... H01L 27/1214
10,360,862 B2 7/2019 Yeh et al.
(Continued)

FOREIGN PATENT DOCUMENTS

CN 106991990 A 7/2017
CN 107221536 A 9/2017
(Continued)

OTHER PUBLICATIONS

International Search Report and Written Opinion dated Dec. 15, 2022, for corresponding PCT Application No. PCT/CN2022/102972.

*Primary Examiner* — Dmitriy Bolotin
(74) *Attorney, Agent, or Firm* — Kinney & Lange, P.A.

(57) ABSTRACT

A display substrate is provided, including: a plurality of scanning signal lines; and a plurality of load compensation units electrically connected to at least some of the plurality of scanning signal lines respectively. The load compensation unit includes at least one of a compensation capacitor and a compensation resistor. The display substrate includes N rows of pixel units, and n rows of pixel units among the N rows of pixel units include different numbers of sub-pixels. The scanning signal line for each of the n rows of pixel units is electrically connected to a respective load compensation
(Continued)

unit, a load compensation value of the load compensation unit for each row of pixel units is negatively related to the number of sub-pixels of the row of pixel units, and the load compensation value includes at least one of a capacitance compensation value and a resistance compensation value.

20 Claims, 22 Drawing Sheets

(52) U.S. Cl.
CPC ... *G09G 3/3696* (2013.01); *G09G 2300/0426* (2013.01); *G09G 2300/043* (2013.01); *G09G 2330/04* (2013.01)

(56) References Cited

U.S. PATENT DOCUMENTS

| | | | |
|---|---|---|---|
| 10,403,194 | B2 | 9/2019 | Li et al. |
| 10,613,670 | B2 | 4/2020 | Lu et al. |
| 10,672,340 | B2* | 6/2020 | Li .................... G09G 3/3258 |
| 10,692,438 | B2 | 6/2020 | Yang |
| 10,797,085 | B2* | 10/2020 | Qin .................... H01L 27/124 |
| 11,063,100 | B2 | 7/2021 | Park et al. |
| 11,100,868 | B2 | 8/2021 | Zhao et al. |
| 11,100,877 | B2 | 8/2021 | Yeh et al. |
| 11,205,364 | B2 | 12/2021 | Liu et al. |
| 11,568,807 | B2 | 1/2023 | Chu et al. |
| 11,650,468 | B2 | 5/2023 | Chen |
| 2010/0013752 | A1* | 1/2010 | Sung .................... G09G 3/3677 349/33 |
| 2013/0257836 | A1* | 10/2013 | Chen .................... G09G 3/3677 345/208 |
| 2017/0337890 | A1* | 11/2017 | Lee .................... G09G 3/3696 |
| 2018/0158417 | A1 | 6/2018 | Xiang et al. |
| 2018/0166018 | A1 | 6/2018 | Yang |
| 2018/0342194 | A1 | 11/2018 | Li et al. |
| 2019/0013374 | A1 | 1/2019 | Park et al. |
| 2019/0064987 | A1 | 2/2019 | Lu et al. |
| 2019/0377234 | A1* | 12/2019 | Yu .................... H01L 27/1218 |
| 2020/0335043 | A1 | 10/2020 | Zhao et al. |
| 2021/0142709 | A1 | 5/2021 | Liu et al. |
| 2021/0327358 | A1 | 10/2021 | Xiang et al. |
| 2022/0139314 | A1 | 5/2022 | Chu et al. |
| 2022/0179270 | A1 | 6/2022 | Chen |
| 2022/0190056 | A1 | 6/2022 | Guo et al. |
| 2024/0143005 | A1* | 5/2024 | Li .................... G05F 1/565 |

FOREIGN PATENT DOCUMENTS

| | | |
|---|---|---|
| CN | 107479757 A | 12/2017 |
| CN | 107481669 A | 12/2017 |
| CN | 107610636 A | 1/2018 |
| CN | 107749247 A | 3/2018 |
| CN | 108257544 A | 7/2018 |
| CN | 108417172 A | 8/2018 |
| CN | 108469697 A | 8/2018 |
| CN | 108665850 A | 10/2018 |
| CN | 108666354 A | 10/2018 |
| CN | 108711406 A | 10/2018 |
| CN | 109061975 A | 12/2018 |
| CN | 109346485 A | 2/2019 |
| CN | 109471306 A | 3/2019 |
| CN | 109637421 A | 4/2019 |
| CN | 110364109 A | 10/2019 |
| CN | 111243524 A | 6/2020 |
| CN | 212515273 U | 2/2021 |
| CN | 113568231 A | 10/2021 |
| CN | 113885264 A | 1/2022 |
| CN | 215494957 U | 1/2022 |

* cited by examiner

DISPLAY SUBSTRATE, DISPLAY APPARATUS, AND LOAD COMPENSATION METHOD APPLIED TO DISPLAY SUBSTRATE

CROSS-REFERENCE TO RELATED APPLICATION

This application is a Section 371 National Stage Application of International Application No. PCT/CN2022/102972, filed Jun. 30, 2022, entitled "DISPLAY SUBSTRATE, DISPLAY APPARATUS, AND LOAD COMPENSATION METHOD APPLIED TO DISPLAY SUBSTRATE", incorporated herein by reference in its entirety.

TECHNICAL FIELD

The present disclosure relates to a field of a display technology, and in particular to a display substrate, a display apparatus, and a load compensation method applied to a display substrate.

BACKGROUND

With a continuous development of technologies, there is an increasing desire for customized design of special-shaped display screens. In a special-shaped display screen, a display panel has a special-shaped display area, and the number of sub-pixels in each row of pixel units in the special-shaped display area is greatly different from the number of sub-pixels in each row of pixel units in a normal display area. The large difference in the numbers of sub-pixels of the rows of pixel units may lead to a large load difference between the normal display area and the special-shaped display area, or lead to a large load difference between adjacent rows of pixel units, so that a poor display may be caused.

The above information disclosed in this section is merely for the understanding of the background of technical concepts of the present disclosure. Therefore, the above information may contain information that does not constitute a related art.

SUMMARY

In an aspect, a display substrate is provided, including: a base substrate, including a display area and a bezel area on at least one side of the display area; a plurality of pixel units in the display area, where the plurality of pixel units are arranged on the base substrate in an array in a row direction and a column direction, and each row of pixel units includes a plurality of sub-pixels; a plurality of scanning signal lines arranged on the base substrate and configured to provide a scanning signal to a plurality of rows of sub-pixels respectively; a plurality of load compensation units arranged on the base substrate and located in the bezel area, where the plurality of load compensation units are electrically connected to at least some of the plurality of scanning signal lines respectively; and a common electrode arranged on the base substrate, where at least part of the common electrode is in the display area, and the common electrode is configured to receive a common voltage signal. At least one of the plurality of load compensation units includes at least one of a compensation capacitor and a compensation resistor; the display substrate includes N rows of pixel units, and n rows of pixel units among the N rows of pixel units include different numbers of sub-pixels, where N is a positive integer greater than or equal to 2, and n is a positive integer greater than or equal to 2 and less than or equal to N; and the scanning signal line for each of the n rows of pixel units is electrically connected to a respective load compensation unit, a load compensation value of the load compensation unit for each row of pixel units is negatively related to the number of sub-pixels of the row of pixel units, and the load compensation value includes at least one of a capacitance compensation value and a resistance compensation value.

According to some exemplary embodiments, the compensation capacitor includes a first compensation capacitor electrode and a second compensation capacitor electrode, where the first compensation capacitor electrode is electrically connected to the scanning signal line, the second compensation capacitor electrode is configured to receive the common voltage signal, and an orthographic projection of the first compensation capacitor electrode on the base substrate at least partially overlaps with an orthographic projection of the second compensation capacitor electrode on the base substrate.

According to some exemplary embodiments, each of a plurality of scanning signal lead wires configured to provide the scanning signal to the n rows of pixel units is electrically connected to a respective compensation capacitor, and an area of the overlap between the first compensation capacitor electrode and the second compensation capacitor electrode of the compensation capacitor for each row of pixel units is negatively related to the number of sub-pixels of the row of pixel units.

According to some exemplary embodiments, a size of at least one of the first compensation capacitor electrode of the compensation capacitor for each row of pixel units in the row direction is negatively related to the number of sub-pixels of the row of pixel units.

According to some exemplary embodiments, the compensation resistor includes a compensation conductive wire; and
  each of a plurality of scanning signal lead wires configured to provide the scanning signal to the n rows of pixel units is electrically connected to a respective compensation conductive wire, and a resistance value of the compensation conductive wire for each row of pixel units is negatively related to the number of sub-pixels of the row of pixel units.

According to some exemplary embodiments, for the at least n rows of pixel units, a length of the compensation conductive wire for each row of pixel units is negatively related to the number of sub-pixels of the row of pixel units, and/or a wire diameter of the compensation conductive wire for each row of pixel units is positively related to the number of sub-pixels of the row of pixel units.

According to some exemplary embodiments, the display substrate further includes: a gate driver circuit arranged on the base substrate and located in the bezel area, where the gate driver circuit is configured to output the scanning signal; and a plurality of scanning signal lead wires arranged on the base substrate and located in the bezel area, where the plurality of scanning signal lead wires are electrically connected to the plurality of scanning signal lines respectively, where the display substrate includes: a first conductive layer on the base substrate; a second conductive layer on a side of the first conductive layer away from the base substrate; and a third conductive layer on a side of the second conductive layer away from the base substrate. The first compensation capacitor electrode and the scanning signal lead wire for a same row of pixel units are connected to each other, and the first compensation capacitor electrode and the scanning signal lead wire for the same row of pixel units are in a same conductive layer selected from the first conductive layer and the second conductive layer.

According to some exemplary embodiments, the first compensation capacitor electrode and the scanning signal lead wire are in the first conductive layer, and the second compensation capacitor electrode is in the second conductive layer or the third conductive layer; or the first compensation capacitor electrode and the scanning signal lead wire are in the second conductive layer, and the second compensation capacitor electrode is in the first conductive layer or the third conductive layer.

According to some exemplary embodiments, the compensation capacitor includes a first sub compensation capacitor and a second sub compensation capacitor, the second compensation capacitor electrode includes a first sub compensation capacitor electrode and a second sub compensation capacitor electrode, and the first sub compensation capacitor electrode and the second sub compensation capacitor electrode are configured to receive the common voltage signal. The first compensation capacitor electrode is in the second conductive layer, the first sub compensation capacitor electrode is in the first conductive layer, and the second sub compensation capacitor electrode is in the third conductive layer. An orthographic projection of the first compensation capacitor electrode on the base substrate at least partially overlaps with an orthographic projection of the first sub compensation capacitor electrode on the base substrate, so as to form the first sub compensation capacitor electrode. The orthographic projection of the first compensation capacitor electrode on the base substrate at least partially overlaps with an orthographic projection of the second sub compensation capacitor electrode on the base substrate, so as to form the second sub compensation capacitor electrode.

According to some exemplary embodiments, the display substrate further includes: a driver chip arranged on the base substrate and located in the bezel area, where the driver chip is configured to output the scanning signal; and a plurality of scanning signal lead wires arranged on the base substrate and located in the bezel area, where the plurality of scanning signal lead wires are electrically connected to the plurality of scanning signal lines respectively. The display substrate includes: a first conductive layer on the base substrate; a second conductive layer on a side of the first conductive layer away from the base substrate; and a third conductive layer on a side of the second conductive layer away from the base substrate; and the first compensation capacitor electrode and the scanning signal lead wire for a same row of pixel units are connected to each other, and the first compensation capacitor electrode and the scanning signal lead wire for the same row of pixel units are in a same conductive layer selected from the first conductive layer and the second conductive layer.

According to some exemplary embodiments, for an odd-numbered row of pixel units, the first compensation capacitor electrode and the scanning signal lead wire are in the first conductive layer; for an even-numbered row of pixel units, the first compensation capacitor electrode and the scanning signal lead wire are in the second conductive layer; and the second compensation capacitor electrode for each of the n rows of pixel units is in the third conductive layer; or for an odd-numbered row of pixel units, the first compensation capacitor electrode and the scanning signal lead wire are in the second conductive layer; for an even-numbered row of pixel units, the first compensation capacitor electrode and the scanning signal lead wire are in the first conductive layer; and the second compensation capacitor electrode for each of the n rows of pixel units are located in the third conductive layer.

According to some exemplary embodiments, for an odd-numbered row of pixel units, the first compensation capacitor electrode and the scanning signal lead wire are in the first conductive layer, and the second compensation capacitor electrode is in the second conductive layer or the third conductive layer; and for an even-numbered row of pixel units, the first compensation capacitor electrode and the scanning signal lead wire are in the second conductive layer, and the second compensation capacitor electrode is in the first conductive layer or the third conductive layer; or for an odd-numbered row of pixel units, the first compensation capacitor electrode and the scanning signal lead wire are in the second conductive layer, and the second compensation capacitor electrode is in the first conductive layer or the third conductive layer; for an even-numbered row of pixel units, the first compensation capacitor electrode and the scanning signal lead wire are in the first conductive layer, and the second compensation capacitor electrode is in the second conductive layer or the third conductive layer.

According to some exemplary embodiments, the first compensation capacitor electrode and the scanning signal lead wire that are connected to each other are formed into a continuously extending integral structure.

According to some exemplary embodiments, the first compensation capacitor electrode includes a plurality of zigzag wire segments extending from the scanning signal lead wire; or the first compensation capacitor electrode includes a first conductive portion extending from the scanning signal lead wire, and the first conductive portion has a hollow structure.

According to some exemplary embodiments, each of the scanning signal lead wires for two adjacent rows of pixel units extends in the row direction, and in the column direction, the first compensation capacitor electrode is between the scanning signal lead wires for the two adjacent rows of pixel units.

According to some exemplary embodiments, the display substrate includes an electrostatic discharge protection ring receiving the common voltage signal; and the second compensation capacitor electrode includes a second conductive portion extending from the electrostatic discharge protection ring.

According to some exemplary embodiments, the second conductive portions of the compensation capacitors for the n rows of pixel units are formed into a continuously extending integral structure; or the second conductive portions of the compensation capacitors for the n rows of pixel units extend from the electrostatic discharge protection ring towards the display area respectively.

According to some exemplary embodiments, the display substrate further includes an electrostatic discharge protection circuit, a terminal of the electrostatic discharge protection circuit is electrically connected to each of the scanning signal lead wire and the scanning signal line, and another terminal of the electrostatic discharge protection circuit is electrically connected to an electrostatic discharge protection ring such that static electricity on the scanning signal lead wire and static electricity on the scanning signal line are released to the electrostatic discharge protection ring.

According to some exemplary embodiments, the display substrate further includes a first conductive transfer portion in the third conductive layer; an end of the scanning signal lead wire proximate to the display area is electrically connected to a first part of the first conductive transfer portion through a first via hole, an end of the scanning signal line away from the display area is electrically connected to a second part of the first conductive transfer portion through a second via hole, and a third part of the first conductive transfer portion is electrically connected to a terminal of the electrostatic discharge protection circuit through a third via hole.

According to some exemplary embodiments, the display substrate further includes a second conductive transfer portion in the third conductive layer; a part of the scanning signal lead wire is electrically connected to a part of the second conductive transfer portion through a fourth via hole, and another part of the second conductive transfer portion is electrically connected to an end of the first compensation capacitor electrode through a fifth via hole; and/or the display substrate further includes a third conductive transfer portion in the third conductive layer; another part of the scanning signal lead wire is electrically connected to a part of the third conductive transfer portion through a sixth via hole, and another part of the third conductive transfer portion is electrically connected to another end of the first compensation capacitor electrode through a seventh via hole.

According to some exemplary embodiments, a part of the scanning signal lead wire is formed as the compensation resistor.

According to some exemplary embodiments, at least part of the scanning signal lead wire configured to provide the scanning signal to at least one row of pixel units includes a plurality of zigzag wire segments, and the compensation resistor includes the plurality of zigzag wire segments.

According to some exemplary embodiments, a difference between overall loads on the scanning signal lines for two adjacent rows of pixel units is within a specified threshold, where the overall load includes a product of a capacitance load and a resistance load on the scanning signal line.

According to some exemplary embodiments, the display substrate includes a common voltage signal bus for providing the common voltage signal; and for the load compensation unit for at least one row of pixel units, the compensation capacitor is on a side of the common voltage signal bus proximate to the display area in the row direction, the compensation resistor is on a side of the compensation capacitor proximate to the display area in the row direction, and the electrostatic discharge protection circuit is on a side of the compensation resistor proximate to the display area.

In another aspect, a display apparatus is provided, including the display substrate described above.

In yet another aspect, a load compensation method applied to a display substrate is provided. The display substrate includes: a base substrate including a display area and a bezel area on at least one side of the display area; a plurality of pixel units in the display area, where the plurality of pixel units are arranged on the base substrate in an array in a row direction and a column direction, and each row of pixel units includes a plurality of sub-pixels; a plurality of scanning signal lines arranged on the base substrate, configured to provide a scanning signal to a plurality of rows of sub-pixels respectively; a plurality of load compensation units arranged on the base substrate and located in the bezel area, where the plurality of load compensation units are electrically connected to at least some of the plurality of scanning signal lines respectively; and a common electrode arranged on the base substrate, where at least part of the common electrode is in the display area, and the common electrode is configured to receive a common voltage signal, where the display substrate includes N rows of pixel units, and N is a positive integer greater than or equal to 2. The method includes: driving the display substrate to display a white picture; acquiring a charging voltage for a $p^{th}$ row of pixel units and a charging voltage for a $q^{th}$ row of pixel units, where the $p^{th}$ row of pixel units is a row of pixel units with a minimum number of sub-pixels among the N rows of pixel units, and the $q^{th}$ row of pixel units is a row of pixel units with a maximum number of sub-pixels among the N rows of pixel units; calculating a difference between the charging voltage for the $p^{th}$ row of pixel units and the charging voltage for the $q^{th}$ row of pixel units; comparing the difference between the charging voltages with a specified voltage threshold; determining, in response to the difference between the charging voltages being greater than the specified voltage threshold, that load compensation is required to be performed; determining, in response to the load compensation being required, n rows of pixel units that require the load compensation, where n is a positive integer greater than or equal to 2 and less than or equal to N, where a difference between the charging voltage for each row of pixel units among the n rows of pixel units and the charging voltage for the $q^{th}$ row of pixel units is greater than the specified threshold; determining a load compensation value of the load compensation unit according to the number of sub-pixels of each row of pixel units among the n rows of pixel units and the number of sub-pixels of the $q^{th}$ row of pixel units, where each of a plurality of scanning signal lines configured to provide the scanning signal to the n rows of pixel units is electrically connected to a respective load compensation unit, a load compensation value for each of the n rows of pixel units is negatively related to the number of the sub-pixels of the row of pixel units, and the load compensation value includes at least one of a capacitance compensation value and a resistance compensation value.

In yet another aspect, a load compensation method applied to a display substrate is provided. The display substrate includes: a base substrate including a display area and a bezel area on at least one side of the display area; a plurality of pixel units in the display area, where the plurality of pixel units are arranged on the base substrate in an array in a row direction and a column direction, and each row of pixel units includes a plurality of sub-pixels; a plurality of scanning signal lines arranged on the base substrate, configured to provide a scanning signal to a plurality of rows of sub-pixels respectively; a plurality of load compensation units arranged on the base substrate and located in the bezel area, where the plurality of load compensation units are electrically connected to at least some of the plurality of scanning signal lines respectively; and a common electrode arranged on the base substrate, where at least part of the common electrode is in the display area, and the common electrode is configured to receive a common voltage signal, where the display substrate includes N rows of pixel units, and N is a positive integer greater than or equal to 2. The method includes: calculating a load difference between any two adjacent rows of pixel units; comparing the load difference with a specified load difference threshold; determining, in response to the load difference being greater than the specified load difference, n rows of pixel units that require load compensation, n being a positive integer greater than or equal to 2 and less than or equal to N, where the load difference between each row of pixel units among the n rows of pixel units and an adjacent row of pixel units is greater than the specified load difference threshold; and determining a load compensation value of the load compensation unit according to a number of sub-pixels of each row of pixel units among the n rows of pixel units and a number of sub-pixels of a $q^{th}$ row of pixel units, where the $q^{th}$ row of pixel units is a row of pixel units with a maximum number of sub-pixels among the N rows of pixel units, each of a plurality of scanning signal lines configured to provide the scanning signal to the n rows of pixel units is electrically connected to a respective load compensation unit, a load compensation value for each of the n rows of pixel units is negatively related to the number of the sub-pixels of the row of pixel units, and the load compensation value includes at least one of a capacitance compensation value and a resistance compensation value.

BRIEF DESCRIPTION OF THE DRAWINGS

By describing exemplary embodiments of the present disclosure with reference to the accompanying drawings in detail, features and advantages of the present disclosure will become more apparent.

DETAILED DESCRIPTION OF EMBODIMENTS

Figure 1A:
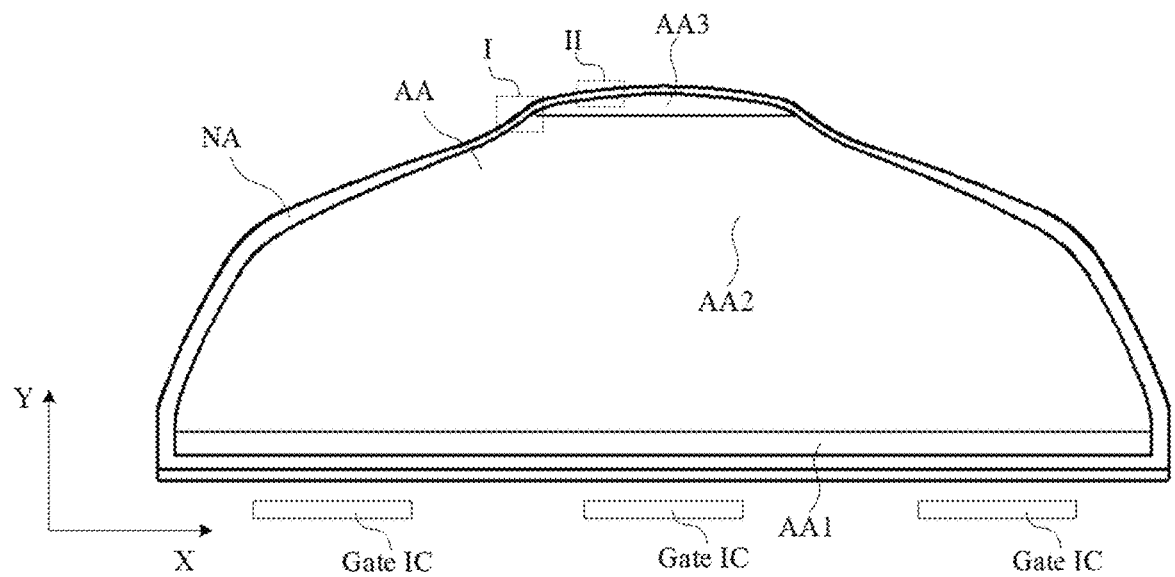
FIG. 1A shows a schematic plan view of a display apparatus according to some exemplary embodiments of the present disclosure.

In order to make objectives, technical solutions and advantages of the present disclosure clearer, technical solutions of embodiments of the present disclosure will be clearly and completely described below with reference to the accompanying drawings. Obviously, the described embodiments are merely some embodiments of the present disclosure, rather than all embodiments. Based on the described embodiments of the present disclosure, all additional embodiments obtained by those ordinary skilled in the art without carrying out inventive effort fall within the scope of protection of the present disclosure.

It should be noted that in the accompanying drawings, for clarity and/or description, sizes and relative sizes of elements may be enlarged. Accordingly, the size and relative size of each element need not to be limited to those shown in the figures. In the specification and the accompanying drawings, the same or similar reference numerals represent the same or similar components.

When an element is described as being "on", "connected to" or "combined with" another element, the element may be directly on the other element, directly connected to the other element, or directly combined with the other element, or an intermediate element may be provided. However, when an element is described as being "directly on", "directly connected to" or "directly combined with" another element, no intermediate element is provided. Other terms and/or expressions used to describe a relationship between elements, such as "between" and "directly between", "adjacent" and "directly adjacent", "on" and "directly on", and so on, should be interpreted in a similar manner. Moreover, the term "connection" may refer to a physical connection, an electrical connection, a communication connection, and/or a fluid connection. In addition, X-axis, Y-axis and Z-axis are not limited to the three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y or Z" and "at least one selected from a group consisting of X, Y and Z" may be interpreted as only X, only Y, only Z, or any combination of two or more of X, Y and Z, such as XYZ, XY, YZ and XZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another one. Thus, for example, a first component, a first member, a first element, a first region, a first layer and/or a first part discussed below may be referred to as a second component, a second member, a second element, a second region, a second layer and/or a second part without departing from teachings of the present disclosure.

For ease of description, spatial relationship terms, such as "upper", "lower", "left", "right", may be used herein to describe a relationship between one element or feature and another element or feature as shown in the figures. It should be understood that the spatial relationship terms are intended to cover other different orientations of a device in use or operation in addition to the orientation described in the figures. For example, if the device in the figures is turned upside down, an element or feature described as being "below" or "under" another element or feature will be oriented "above" or "on" the other element or feature.

Here, the terms "substantially", "about", "approximately" and other similar terms are used as terms of approximation rather than terms of degree, and they are intended to explain an inherent deviation of a measured or calculated value that will be recognized by those ordinary skilled in the art. Taking into account a process fluctuation, a measurement problem, and an error related to a measurement of a specific quantity (that is, a limitation of a measurement system), the terms "substantially", "about" or "approximately" used herein includes a stated value and means that a specific value determined by those ordinary skilled in the art is within an acceptable range of deviation. For example, "about" may mean being within one or more standard deviations, or within ±30%, ±20%, ±10% or ±5% of the stated value.

It should be noted that the expression of "same layer" herein refers to a layer structure that is formed by first forming, using a same film forming process, a film layer used to form a specific pattern, and then patterning, using one patterning process, the film layer with a same mask. Depending on the specific patterns, the patterning process may include multiple processes of exposure, development, or etching, and the specific pattern in the formed layer structure may be continuous or discontinuous. That is, a plurality of elements, components, structures and/or parts located in the "same layer" are made of the same material and formed by the same patterning process. Generally, a plurality of elements, components, structures and/or parts located in the "same layer" have substantially identical thicknesses.

Those skilled in the art should understand that, unless otherwise specified, the expressions "continuously extending", "integral structure", "overall structure" or similar expressions herein mean that a plurality of elements, components, structures and/or parts are located in the same layer and generally formed by the same patterning process during the manufacturing process, and that these elements, components, structures and/or parts are not separated or broken, but are formed as a continuously extending structure.

It should be noted that, the expression "negatively related" herein means that two quantities have opposite change directions. For example, when one quantity becomes larger, the other quantity becomes less; and when one quantity becomes less, the other quantity becomes larger. The expression "positively related" means that two quantities have the same change direction. For example, when one quantity becomes larger, the other quantity also becomes larger; and when one quantity becomes less, the other quantity also becomes less.

The embodiments of the present disclosure provide at least a display substrate and a display apparatus. The display substrate includes: a base substrate, including a display area and a bezel area located on at least one side of the display area; a plurality of pixel units located in the display area, where the plurality of pixel units are arranged on the base substrate in an array in a row direction and a column direction, and each row of pixel units includes a plurality of sub-pixels; a plurality of scanning signal lines arranged on the base substrate, where the plurality of scanning signal lines are used to provide a scanning signal to a plurality of rows of sub-pixels respectively; a plurality of load compensation units arranged on the base substrate and located in the bezel area, where the plurality of load compensation units are electrically connected to at least some of the plurality of scanning signal lines respectively; and a common electrode arranged on the base substrate, where at least part of the common electrode is located in the display area, and the common electrode is configured to receive a common voltage signal. At least one load compensation unit includes at least one of a compensation capacitor and a compensation resistor. The display substrate includes N rows of pixel units, and n rows of pixel units among the N rows of pixel units include different numbers of sub-pixels, where N is a positive integer greater than or equal to 2, and n is a positive integer greater than or equal to 2 and less than or equal to N. The scanning signal line for each of the n rows of pixel units is electrically connected to a respective load compensation unit, a load compensation value of the load compensation unit for each row of pixel units is negatively related to the number of sub-pixels of the row of pixel units, and the load compensation value includes at least one of a capacitance compensation value and a resistance compensation value. In the embodiments of the present disclosure, load compensation may be performed for the rows of pixel units having inconsistent loads. For example, a load compensation unit may be electrically connected to the scanning signal line for each row of pixel units that needs the load compensation, so that the loads on the scanning signal lines for the respective rows of pixel units are substantially consistent. In this way, it is possible to at least improve or even eliminate the display non-uniformity of sub display areas and other undesirable phenomena.

Figure 2A:
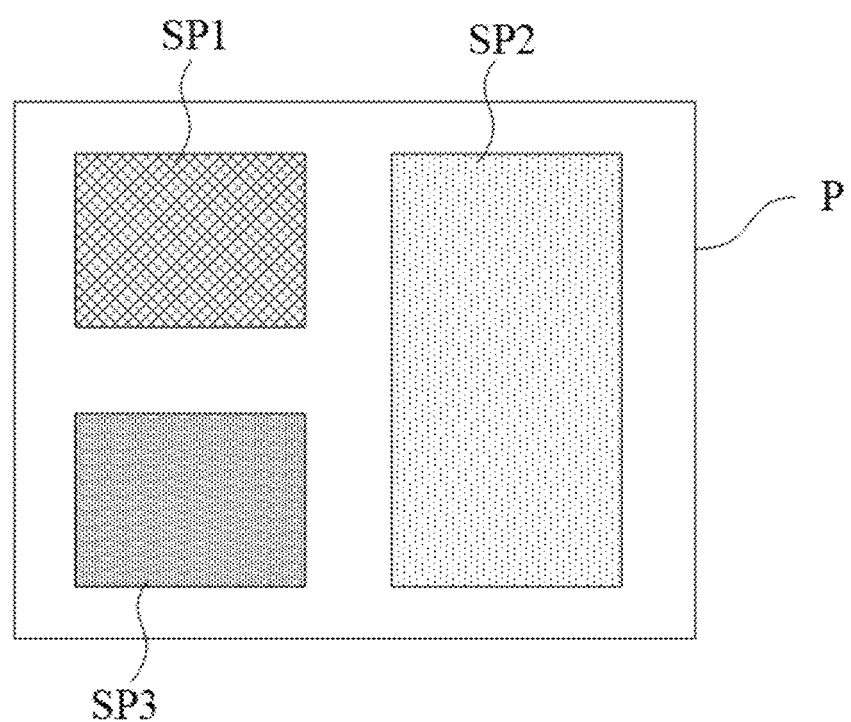
FIG. 2A schematically shows a schematic diagram of a pixel layout of the display apparatus shown in FIG. 1A.
Figure 2B:
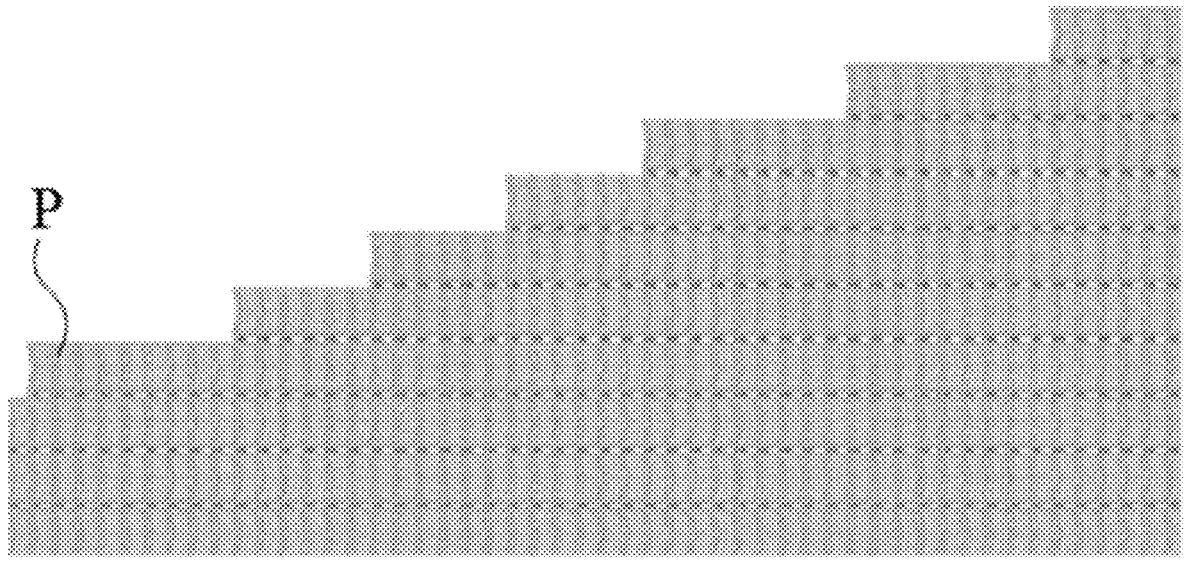
FIG. 2B shows a partial enlarged view of the part I shown in FIG. 1A.
Figure 2C:
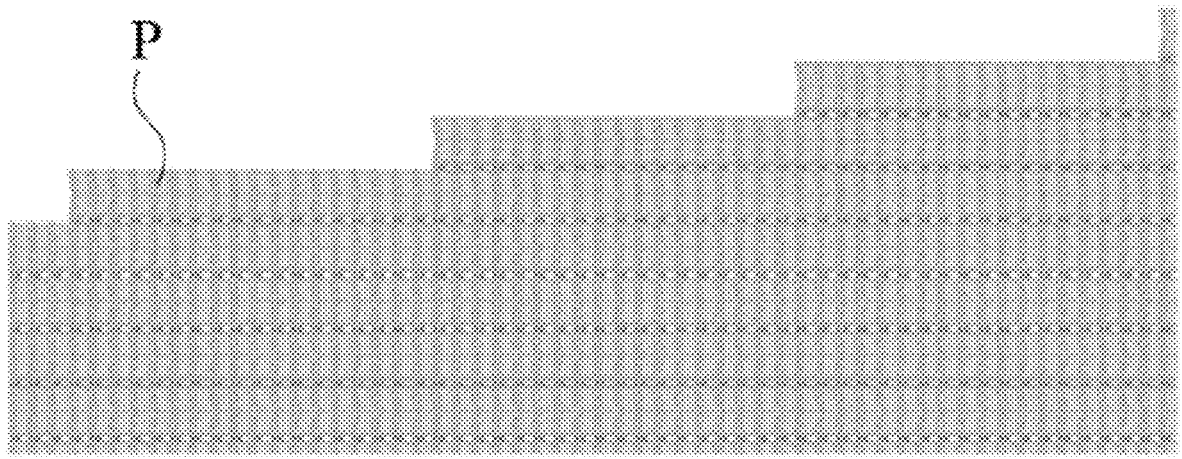
FIG. 2C shows a partial enlarged view of the part II shown in FIG. 1A.

FIG. 1A shows a schematic plan view of a display apparatus according to some exemplary embodiments of the present disclosure. FIG. 2A schematically shows a schematic diagram of a pixel layout of the display apparatus shown in FIG. 1A. FIG. 2B shows a partial enlarged view of the part I shown in FIG. 1A. FIG. 2C shows a partial enlarged view of the part II shown in FIG. 1A.

With reference to FIG. 1A and FIG. 2A to FIG. 2C in combination, a display apparatus 1000 may include a display substrate. The display substrate may include a base substrate 100, and the base substrate 100 may include a display area AA and a bezel area NA located on at least one side of the display area. It should be noted that the bezel area NA surrounds the display area AA in the embodiments shown in FIG. 1, but the embodiments of the present disclosure are not limited to this. In other embodiments, the bezel area NA may be located on at least one side of the display area AA without surrounding the display area AA.

The display substrate may include a plurality of pixel units P in the display area AA. It should be noted that the pixel unit P is a minimum unit for displaying an image. For example, the pixel unit P may include a light-emitting device that emits white light and/or a light-emitting device that emits color light.

A plurality of pixel units P may be arranged in a matrix with rows extending along a first direction X (e.g., a row direction) and columns extending along a second direction Y (e.g., a column direction). However, the embodiments of the present disclosure do not specifically limit an arrangement form of the pixel units P, and the pixel units P may be arranged in various forms. For example, the pixel units P may be arranged such that a direction inclined with respect to the first direction X and the second direction Y is the column direction, and a direction intersecting the column direction is the row direction.

A pixel unit P may include a plurality of sub-pixels. For example, a pixel unit P may include three sub-pixels, including a first sub-pixel SP1, a second sub-pixel SP2, and a third sub-pixel SP3. For another example, a pixel unit P may include four sub-pixels, including a first sub-pixel, a second sub-pixel, a third sub-pixel, and a fourth sub-pixel. For example, the first sub-pixel SP1 may be a red sub-pixel, the second sub-pixel SP2 may be a green sub-pixel, the third sub-pixel SP3 may be a blue sub-pixel, and the fourth sub-pixel may be a white sub-pixel.

Figure 3A:
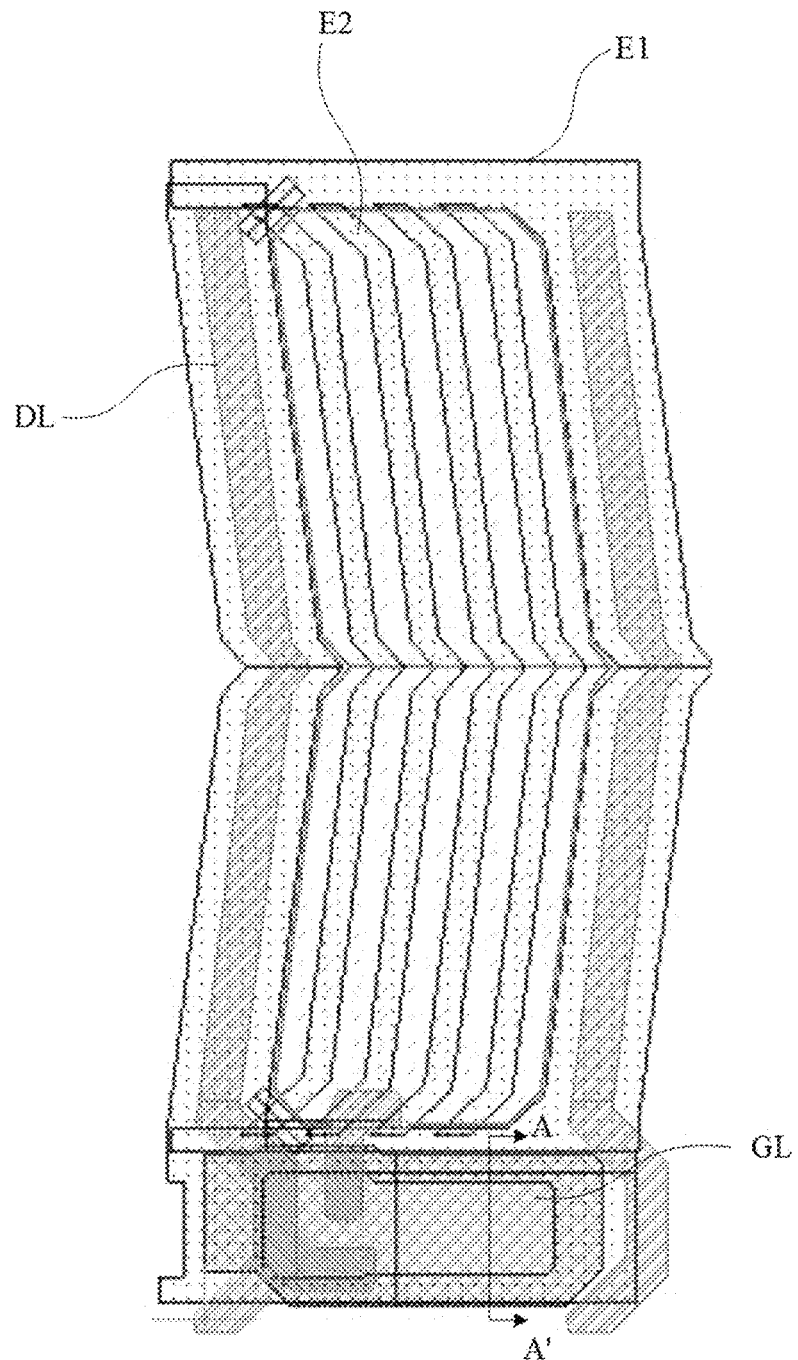
FIG. 3A schematically shows a schematic structural diagram of a sub-pixel of a display substrate according to some exemplary embodiments of the present disclosure.

In some exemplary embodiments, the display substrate may be a liquid crystal display substrate, for example, an array substrate of a liquid crystal display panel. FIG. 3A schematically shows a schematic structural diagram of a sub-pixel in a display substrate according to some exemplary embodiments of the present disclosure. With reference to FIG. 1A to FIG. 3A in combination, the display substrate may include a first electrode E1, a second electrode E2, a data signal line DL and a scanning signal line GL, which are all arranged on the base substrate 100. It should be understood that in a case that the display panel is a liquid crystal display panel, the display panel may include a liquid crystal layer between an array substrate and a color filter substrate. A specific structure of the array substrate, the color filter substrate and the liquid crystal layer may refer to a structure of an existing liquid crystal display panel, and details will not be described here. The first electrode E1 and the second electrode E2 may be driven by a driving signal so that a corresponding liquid crystal electric field may be generated. Liquid crystals in the liquid crystal layer may deflect under an action of the liquid crystal electric field, so as to realize a corresponding display function. For example, the liquid crystal layer may be arranged between the first electrode E1 and the second electrode E2. One of the first electrode E1 and the second electrode E2 may be a pixel electrode, and the other one of the first electrode E1 and the second electrode E2 may be a common electrode. For example, the first electrode E1 is a common electrode, and the second electrode E2 is a pixel electrode.

In some specific embodiments, at least one sub-pixel further includes a thin film transistor T electrically connected to the data signal line DL. In the embodiments of the present disclosure, the thin film transistor T may have a top-gate structure or a bottom-gate structure, which may be specifically determined as desired and is not limited here. The thin film transistor T in the embodiments of the present disclosure will be described below by taking a thin film transistor T having a top-gate structure as an example.

Figure 3B:
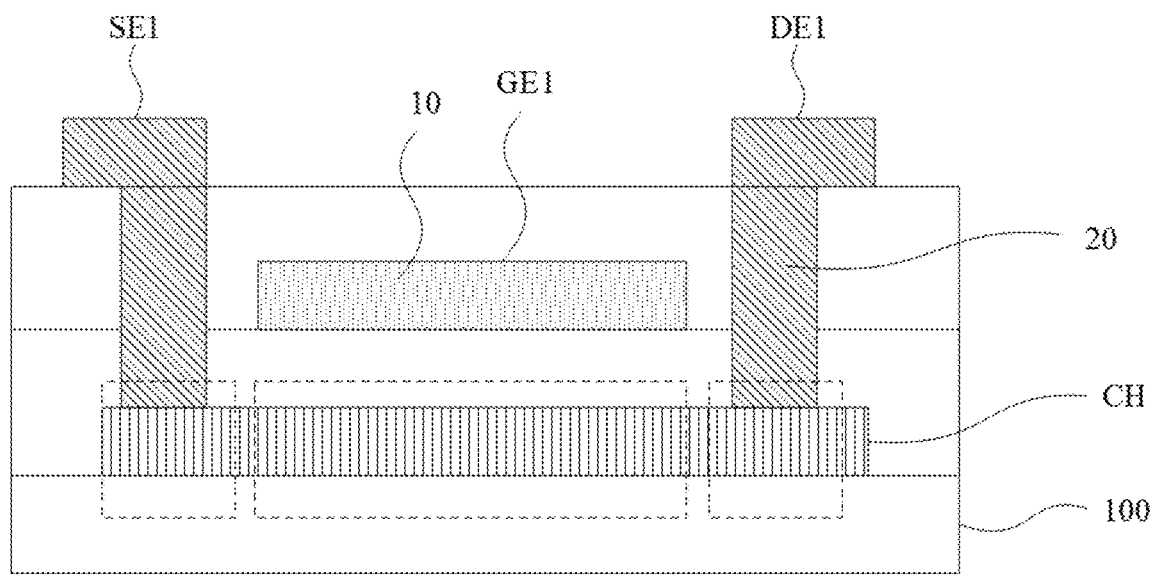
FIG. 3B schematically shows a sectional view of a thin film transistor in embodiments of the present disclosure.
Figure 16:
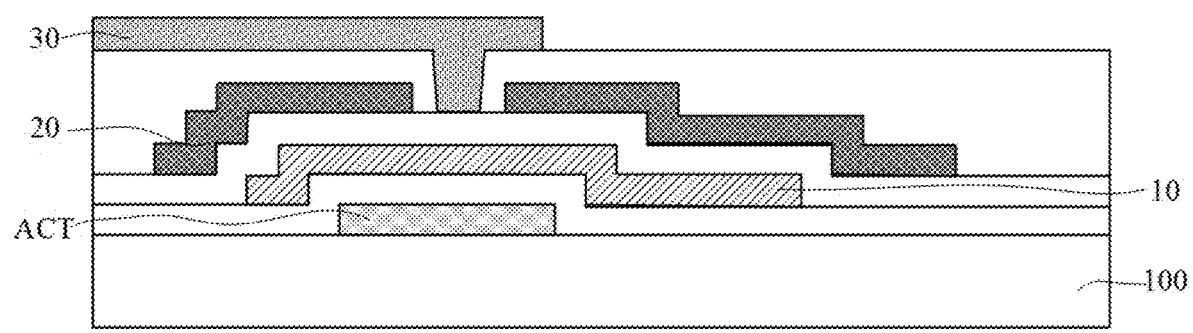
FIG. 16 shows a sectional view of the display substrate according to some exemplary embodiments of the present disclosure taken along the line AA' in FIG. 3A.

FIG. 3B schematically shows a sectional view of a thin film transistor in the embodiments of the present disclosure, and FIG. 16 shows a sectional view of a display substrate taken along line AA' in FIG. 2B, according to some exemplary embodiments of the present disclosure. With reference to FIG. 3A, FIG. 3B and FIG. 16 in combination, the display substrate may include: a semiconductor layer ACT on the base substrate 100; a first conductive layer 10 on a side of the semiconductor layer ACT away from the base substrate 100; a second conductive layer 20 on a side of the first conductive layer 10 away from the base substrate 100; and a third conductive layer 30 on a side of the second conductive layer 20 away from the base substrate 100. For example, the thin film transistor T may include an active layer CH, a gate electrode GE1, a source electrode SE1, and a drain electrode DE1. The active layer CH of the thin film transistor T may be in the semiconductor layer ACT, the gate electrode GE1 of the thin film transistor T may be in the first conductive layer 10, and the source electrode SE1 and the drain electrode DE1 of the thin film transistor T may be in the second conductive layer 20. For example, the first electrode E1 (e.g., a common electrode) may be in the third conductive layer 30.

As shown in FIG. 3A, the display substrate may be designed with a sub-pixel structure of 2Pixel2Domain (2P2D). Each sub-pixel may include a plurality of strip pixel electrodes E2, and the plurality of strip pixel electrodes E2 of each sub-pixel are separated by slits. The so-called "2Pixel2Domain" means that the pixel electrodes E2 of two adjacent rows of sub-pixels have different extension directions, and the pixel electrodes E2 of each adjacent two rows of sub-pixels are approximately symmetrical with respect to a scanning signal line GL. As such, in the display substrate, for two adjacent rows of sub-pixels, the pixel electrodes E2 of one row of sub-pixels and the common electrode E1 may form a first domain electric field, and the pixel electrodes E2 of the other row of sub-pixels and the common electrode E1 may form a second domain electric field. A direction of the first domain electric field is different from a direction of the second domain electric field. In other words, an angle is formed between the directions of the electric fields corresponding to every two adjacent rows of sub-pixels, so that light output directions of the two adjacent rows of sub-pixels may be mutually compensated, which may help improve the display effect.

Figure 1B:
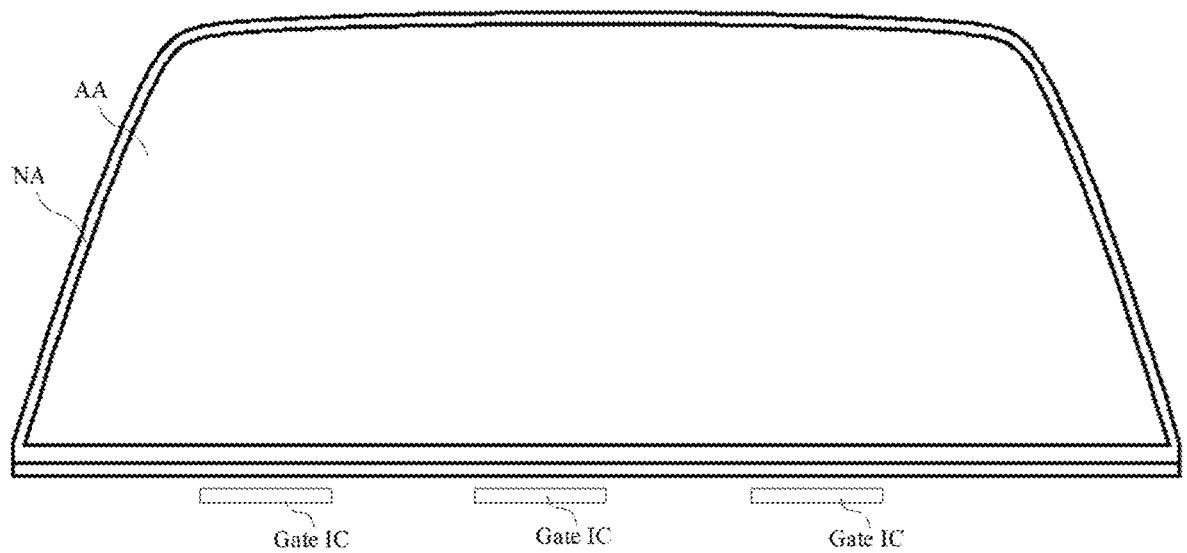
FIG. 1B to FIG. 1D schematically show examples of several special shapes of a display substrate.
Figure 1C:
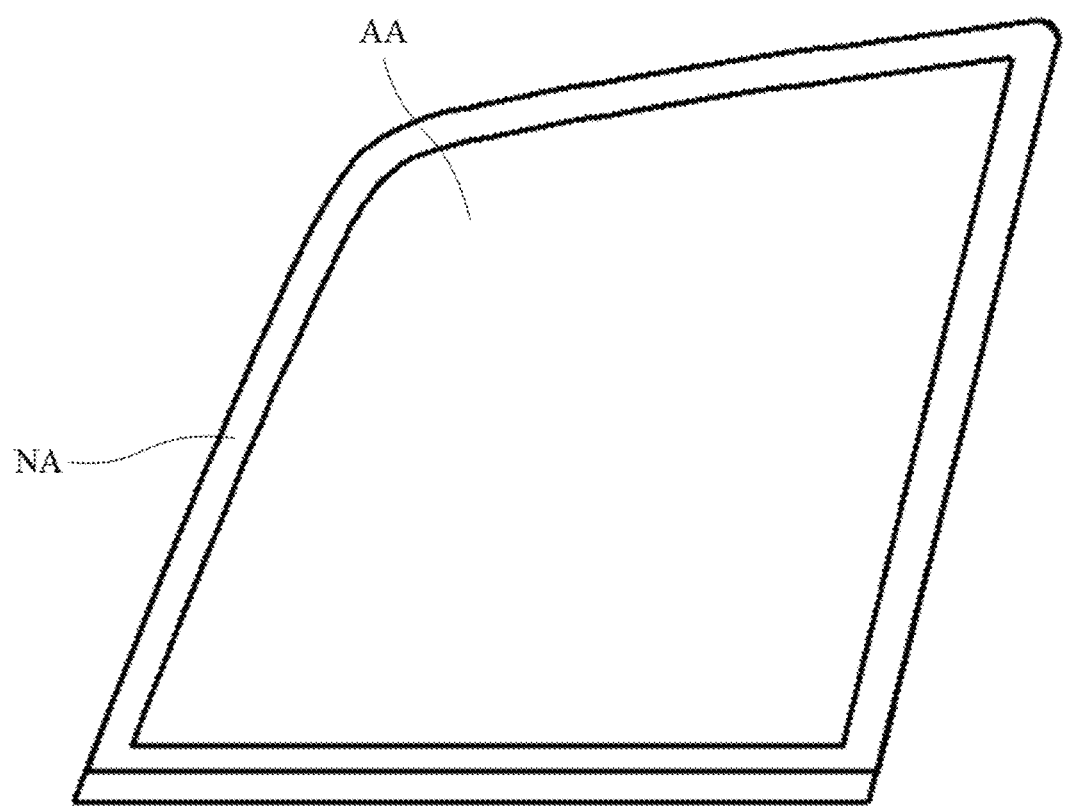
Figure 1D:
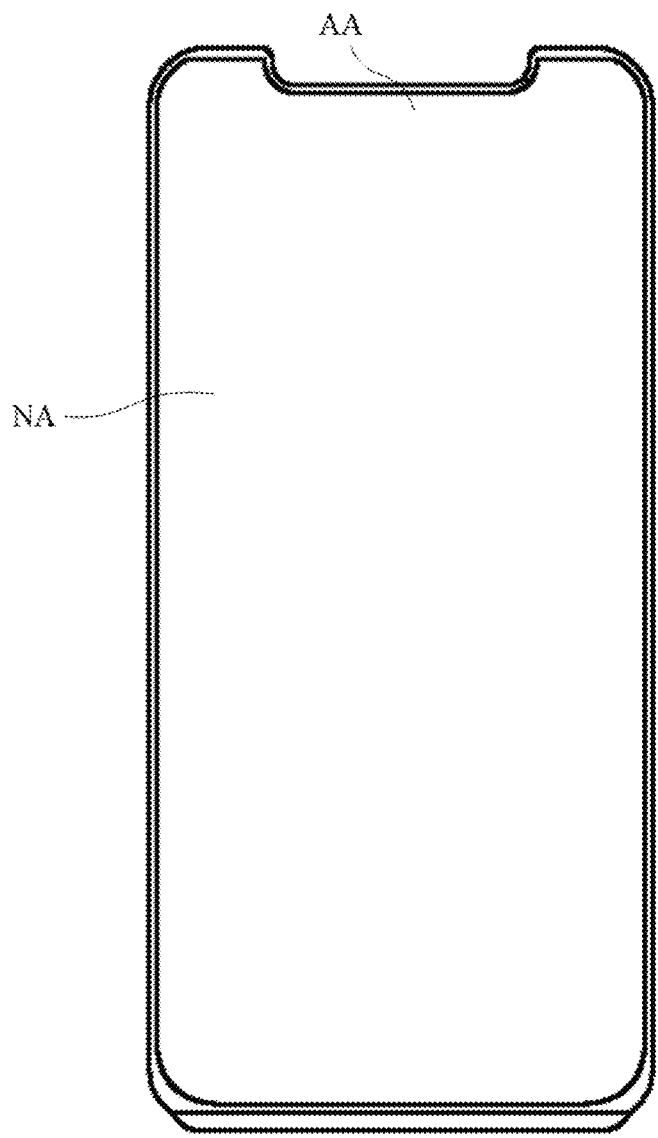

Referring back to FIG. 1A, the display substrate may have an irregular shape, which may include any special shape. For example, FIG. 1B to FIG. 1D schematically show examples of several special shapes of a display substrate. It should be understood that the embodiments of the present disclosure do not specifically limit the shape of the display substrate. A special shape shown in FIG. 1A will be illustrated below by way of example in describing the embodiments of the present disclosure.

In an embodiment of the present disclosure, the display substrate includes N rows of pixel units, where N is a positive integer greater than or equal to 2. For example, referring to FIG. 1A, the display area AA may include a plurality of sub display areas AA1, AA2 and AA3. For example, in each of the sub display areas AA1, AA2 and AA3, at least one row of pixel units is provided. In the embodiments shown in FIG. 1A, the number of sub-pixels in each rows of pixel units is irregularly decreased from the last (bottom) row of pixel units to the first (top) row of pixel units. For example, the number of sub-pixels of each row of pixel units in the sub display area AA3 is greater than the number of sub-pixels of each row of pixel units in the sub display area AA2, and the number of sub-pixels of each row of pixel units in the sub display area AA2 is greater than the number of sub-pixels of each row of pixel units in the sub display area AA1.

For each row of pixel units, a scanning signal line GL is provided to supply the scanning signal to the respective sub-pixels in the row of pixel units. In the embodiments of the present disclosure, among the N rows of pixel units, n rows of pixel units include different numbers of sub-pixels, where n is a positive integer greater than or equal to 2 and less than or equal to N. The scanning signal lines GL for the n rows of pixel units have different loads electrically connected. For example, a theoretical load of the scanning signal line for each row of pixel units may be calculated according to a design diagram of the display substrate, and the load corresponding to the scanning signal line may include a resistance load and a capacitance load.

A resistance R of the scanning signal line for an $i^{th}$ row of pixel units in the N rows of pixel units may be calculated using the following formula:

$$Ri = Rs*L/W,$$

where L represents a length of the scanning signal line for the $i^{th}$ row of pixel units, W represents a width of the scanning signal line for the $i^{th}$ row of pixel units, and Rs represents a sheet resistance of a metal material used for the scanning signal line for the $i^{th}$ row of pixel units.

A capacitance Ci of the scanning signal line for the $i^{th}$ row of pixel units in the N rows of pixel units may be calculated using the following formula:

$$Ci = Ni*pixel,$$

where Ni represents the number of sub-pixels of the $i^{th}$ row of pixel units, and Cpixel represents a capacitance load value of a single sub-pixel, which may be obtained by a software extraction or by calculating a plate capacitance according to an area.

The inventors found through researches that the respective rows of pixel units with different loads achieve different charging voltages within the same charging time, which may cause a non-uniform display of the sub display areas and other undesirable phenomena in an actual display.

In the embodiments of the present disclosure, the load compensation may be performed on the rows of pixel units with different loads. For example, load compensation units may be electrically connected to the scanning signal lines for the respective rows of pixel units that needs the load compensation, so that the loads on the scanning signal lines for the respective rows of pixel units are substantially consistent. In this way, it is possible to at least improve or even eliminate the non-uniform display of the sub display areas and other undesirable phenomena.

With reference to FIG. 1A to FIG. 3B in combination, the display substrate according to some exemplary embodiments of the present disclosure may include: a base substrate 100, including a display area AA and a bezel area NA on at least one side of the display area; a plurality of pixel units P in the display area AA, where the plurality of pixel units are arranged on the base substrate 100 in an array in the row direction X and the column direction Y, and each row of pixel units P may include a plurality of sub-pixels; a plurality of scanning signal lines GL arranged on the base substrate 100, where the plurality of scanning signal lines GL are used to provide a scanning signal to the plurality of rows of pixel units P respectively; a plurality of load compensation units 200 arranged on the base substrate 100 and located in the bezel area NA, where the plurality of load compensation units are electrically connected to at least some of the plurality of scanning signal lines GL respectively; and a common electrode E1 arranged on the base substrate 100, wherein at least part of the common electrode E1 is in the display area AA, and the common electrode E1 is configured to receive a common voltage signal.

Figure 17A:
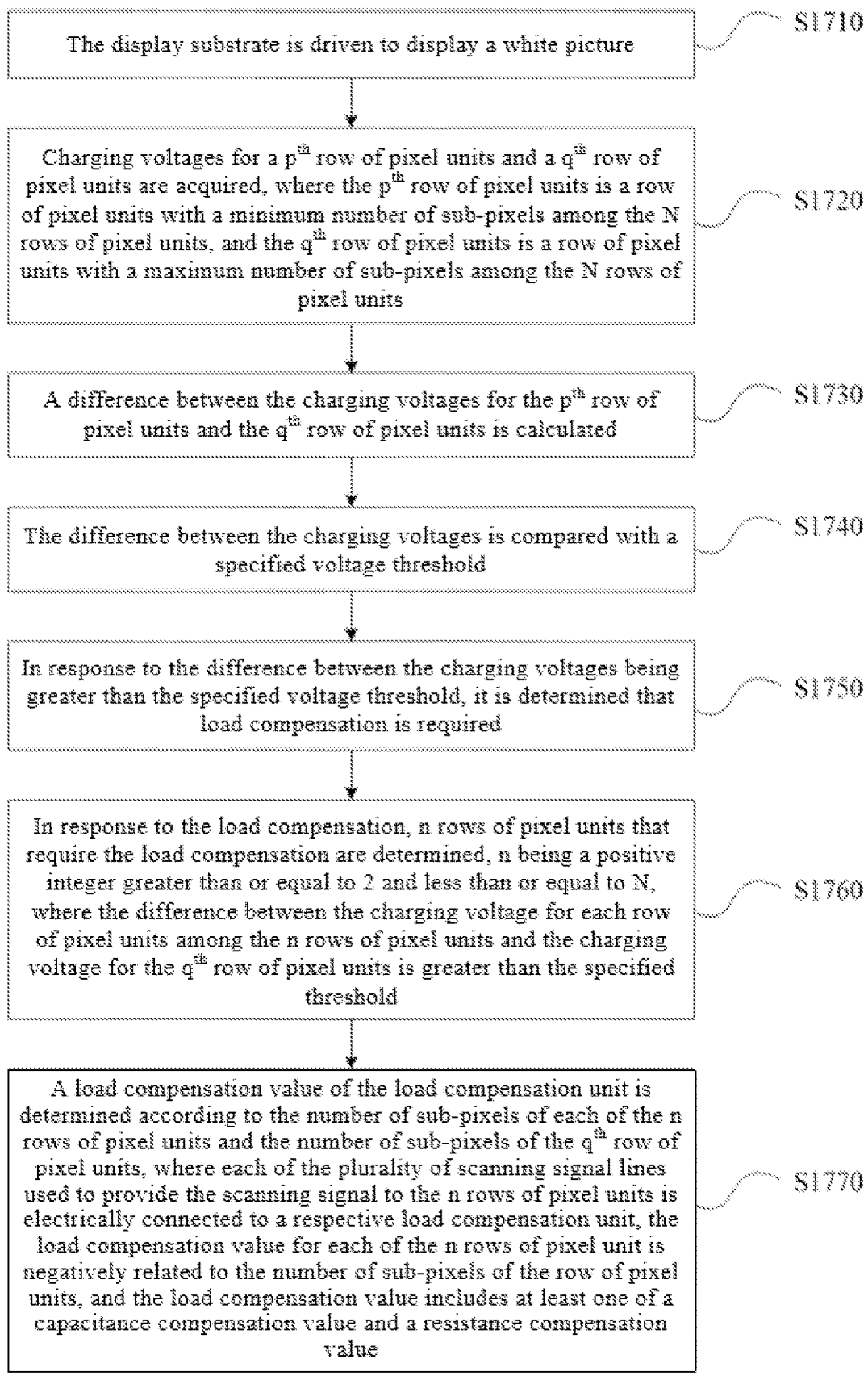
FIG. 17A shows a flowchart of a load compensation method applied to a display substrate according to some exemplary embodiments of the present disclosure.

FIG. 17A shows a flowchart of a load compensation method applied to a display substrate according to some exemplary embodiments of the present disclosure. The load compensation method may include steps S1710 to S1770.

In step S1710, the display substrate is driven to display a white picture. For example, for a display substrate such as an ADS type liquid crystal display substrate, a white picture requires the largest charging voltage.

In step S1720, a charging voltage for a $p^{th}$ row of pixel units and a charging voltage for a $q^{th}$ row of pixel units are acquired. The $p^{th}$ row of pixel units is a row of pixel units with a minimum number of sub-pixels among the N rows of pixel units. The $q^{th}$ row of pixel units is a row of pixel units with a maximum number of sub-pixels among the N rows of pixel units. For example, the $p^{th}$ row of pixel units is a row of pixel units with a small load, and the charging voltage on the corresponding scanning signal line is large, which is recorded as Vmax. The $q^{th}$ row of pixel units is a row of pixel units with a large load, and the charging voltage on the corresponding scanning signal line is small, which is recorded as Vmin.

In step S1730, a difference between the charging voltage for the $p^{th}$ row of pixel units and the charging voltage for the $q^{th}$ row of pixel units is calculated. For example, there is δV=Vmax−Vmin, where SV represents the difference between the charging voltages.

In step S1740, the difference between the charging voltages is compared with a specified voltage threshold. For example, the specified voltage threshold may be a critical value between an acceptable range and an unacceptable range. The acceptable range is based on the fact that a display difference across an entire panel, such as a non-uniform display or other defects, cannot be perceived by a user. In other words, when the entire panel is in a same gray scale, the display different is invisible to naked eyes if δV is less than one gray scale, and thus the critical value may be calculated. According to the gamma curve, a minimum voltage difference of a signal (i.e. the specified voltage threshold) for 6 bit data is determined to be about 30 mV, and a minimum voltage difference of a signal (i.e. the specified voltage threshold) for 8 bit data is determined to be about 8 mV.

In step S1750, in response to the difference between the charging voltages being greater than the specified voltage threshold, it is determined that the load compensation is required to be performed. For example, when it is determined that the difference between the charging voltage for at least one row of pixel units and Vmin is greater than the specified voltage threshold (for example, 8 mV), it is determined that the load compensation is required to be performed for the display substrate.

In step S1760, in response to the load compensation being required, n rows of pixel units that require the load compensation are determined, where n is a positive integer greater than or equal to 2 and less than or equal to N, and the difference between the charging voltage for each row of pixel units among the n rows of pixel units and the charging voltage for the $q^{th}$ row of pixel units is greater than the specified threshold.

For example, the voltage difference between the charging voltage for each of the remaining rows of pixel units other than the $q^{th}$ row of pixel units and Vmin is determined, so as to find out all rows of pixel units corresponding to the voltage difference greater than the specified voltage threshold (for example, 8 mV), and these rows of pixel units are determined as the n rows of pixel units that require the load compensation. In this way, it is possible to accurately determine the n rows of pixel units that require the load compensation.

In step S1770, a load compensation value of the load compensation unit is determined according to the number of sub-pixels of each row of pixel units among the n rows of pixel units and the number of sub-pixels of the $q^{th}$ row of pixel units. Each of the plurality of scanning signal lines used to provide the scanning signal to the n rows of pixel units is electrically connected to a respective load compensation unit, and the load compensation value for each of the n rows of pixel unit is negatively related to the number of sub-pixels of the row of pixel units. The load compensation value includes at least one of a capacitance compensation value and a resistance compensation value. In this way, the load compensation is performed on the scanning signal lines for the n rows of pixel units on the basis of an accurate determination of the n rows of pixel units that require the load compensation, so that the loads on the scanning signal lines for the n rows of pixel units are substantially consistent. Therefore, it is possible to at least improve or even eliminate the non-uniform display of the sub display areas and other undesirable phenomena.

Figure 5:
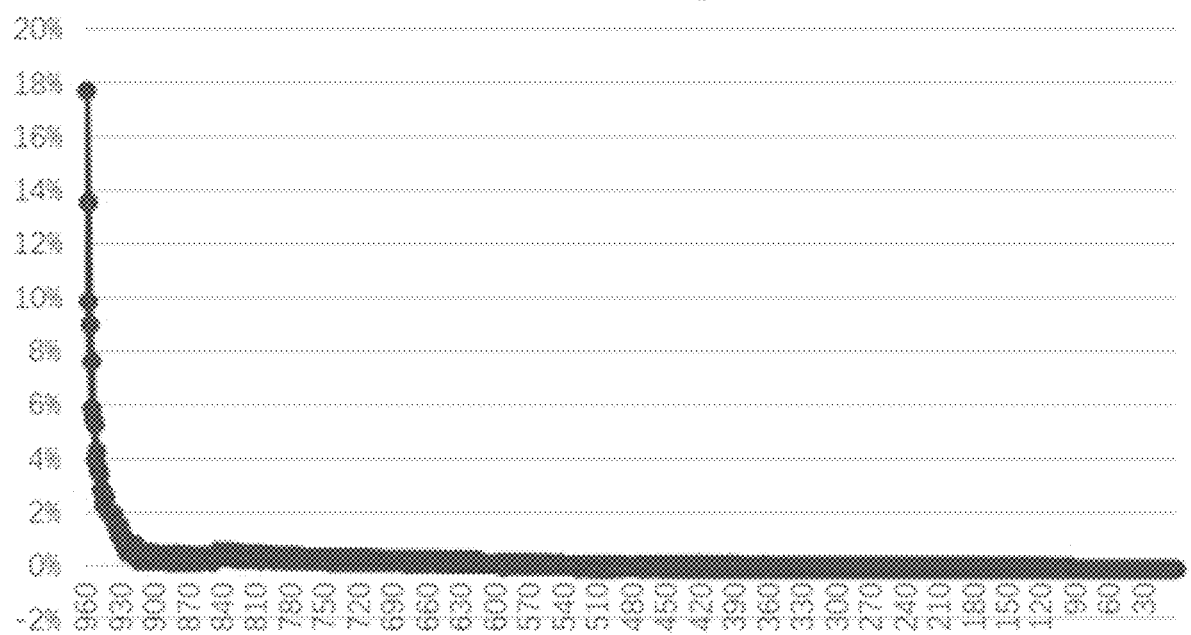
FIG. 5 shows a load difference ratio diagram of signal scanning lines for adjacent two rows of pixel units in the display substrate shown in FIG. 1A before load compensation is performed.
Figure 17B:
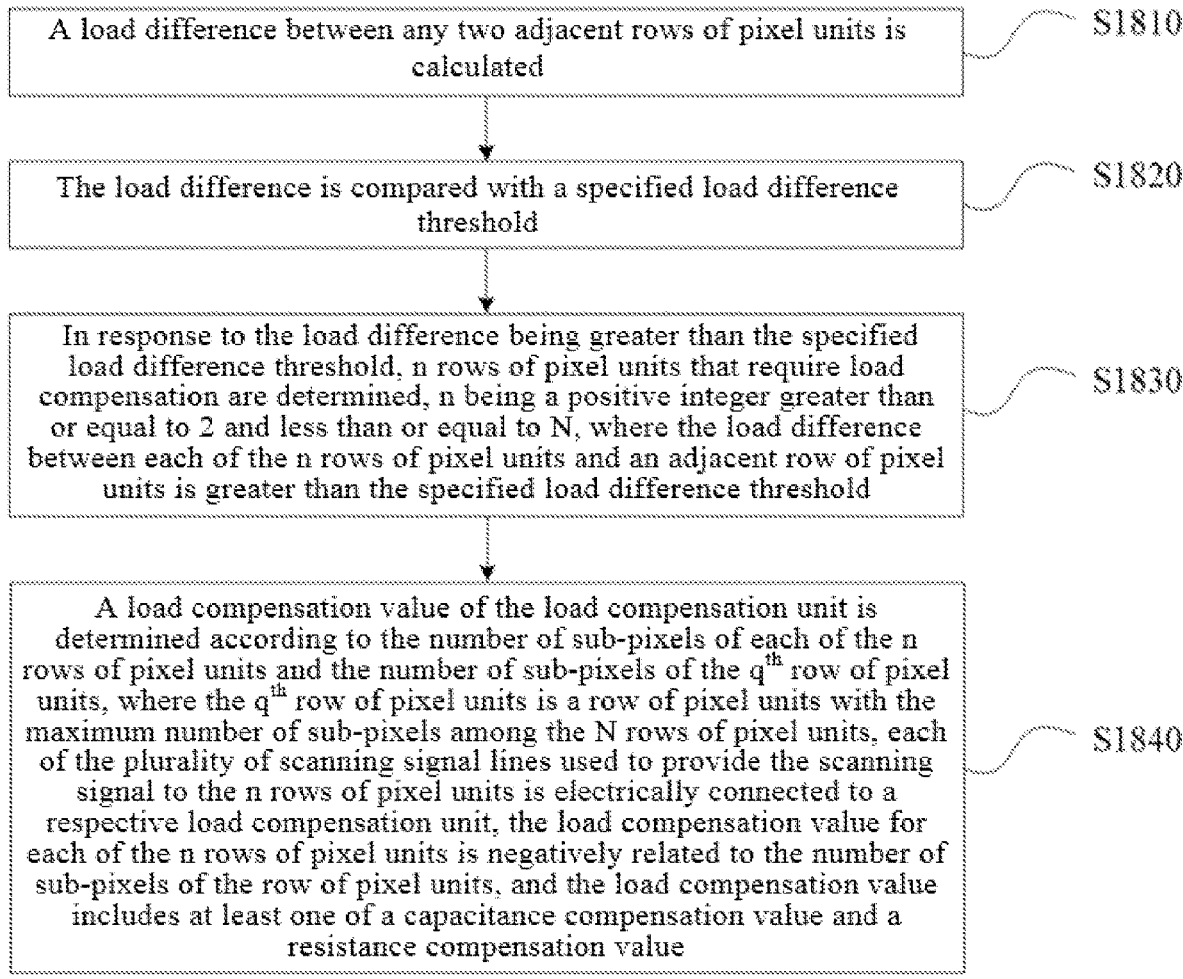
FIG. 17B shows a flowchart of a load compensation method applied to a display substrate according to some other exemplary embodiments of the present disclosure.

FIG. 5 shows a load difference ratio diagram of signal scanning lines for adjacent two rows of pixel units in the display substrate shown in FIG. 1A before load compensation is performed. FIG. 17B shows a flowchart of a load compensation method applied to a display substrate according to some other exemplary embodiments of the present disclosure. With reference to FIG. 5 and FIG. 17B, the load compensation method may include steps S1810 to S1870.

In step S1810, a load difference between any two adjacent rows of pixel units is calculated. For example, the load difference may be represented by a load difference percentage Ai of the two adjacent rows of pixel units:

$$Ai=[(R_i*C_i-R_{i+1}*C_{i+1})/R_{i+1}*C_{i+1}]*100\%,$$

where Ri and Ci respectively represent the resistance load value and the capacitance load value for an $i^{th}$ row of pixel units, and $R_{i+1}$ and $C_{i+1}$ respectively represent the resistance load value and the capacitance load value for an $(i+1)^{th}$ row of pixel units.

In step S1820, the load difference is compared with a specified load difference threshold. For example, the load difference threshold may be determined according to whether a display difference is visible to naked eyes of the user, and the load difference threshold may be about 2% to 5%.

In step S1830, n rows of pixel units that require load compensation are determined in response to the load difference being greater than the specified load difference threshold, where n is a positive integer greater than or equal to 2 and less than or equal to N. The load difference between each row of pixel units among the n rows of pixel units and an adjacent row of pixel units is greater than the specified load difference threshold.

As shown in FIG. 5, according to the load difference ratio diagram of the scanning signal lines for two adjacent rows of pixel units, for the embodiment shown in FIG. 1A, a sudden change of the Ai value starts at the $940^{th}$ row, and the change continues to the $960^{th}$ row, therefore the load compensation is performed for the $940^{th}$ row of pixel units to the $960^{th}$ row of pixel units. In addition, starting from the $950^{th}$ row, the Ai value between two adjacent rows is greater than the load difference threshold, and the $950^{th}$ row of pixel units to the $960^{th}$ row of pixel units are required to be compensated. A region that requires the compensation is the sub display area AA1 shown in FIG. 1A. It should be noted that although the sub display area AA2 is a special-shaped display area, it has no sudden change in the Ai value and the Ai value between two adjacent rows within it is also less than the load difference threshold, and thus no load compensation is required. In this way, it is possible to accurately determine the n rows of pixel units that require the load compensation.

In step S1840, a load compensation value of the load compensation unit is determined according to the number of sub-pixels of each row of pixel units among the n rows of pixel units and the number of sub-pixels of a $q^{th}$ row of pixel units. The $q^{th}$ row of pixel units is a row of pixel units with the maximum number of sub-pixels among the N rows of pixel units. Each of the plurality of scanning signal lines used to provide the scanning signal to the n rows of pixel units is electrically connected to a respective load compensation unit. The load compensation value for each of the n rows of pixel units is negatively related to the number of sub-pixels of the row of pixel units. The load compensation value includes at least one of a capacitance compensation value and a resistance compensation value. In this way, the load compensation is performed on the scanning signal lines for the n rows of pixel units on the basis of an accurate determination of the n rows of pixel units that require the load compensation, so that the loads on the scanning signal lines for the n rows of pixel units are substantially consistent. Therefore, it is possible to at least improve or even eliminate the non-uniform display of the sub display areas and other undesirable phenomena.

In the embodiments of the present disclosure, at least one load compensation unit may include at least one of a compensation capacitor and a compensation resistor.

For example, the compensation capacitor may include a first compensation capacitor electrode and a second compensation capacitor electrode. The first compensation capacitor electrode is electrically connected to the scanning signal line. The second compensation capacitor electrode is configured to receive the common voltage signal. An orthographic projection of the first compensation capacitor electrode on the base substrate at least partially overlaps with an orthographic projection of the second compensation capacitor electrode on the base substrate. Each of the plurality of scanning signal lead wires used to provide the scanning signal to the n rows of pixel units is electrically connected to a respective compensation capacitor, and an area of the overlap between the first compensation capacitor electrode and the second compensation capacitor electrode of the compensation capacitor for each row of pixel units is negatively related to the number of sub-pixels of the row of pixel units. A size of at least one of the first compensation capacitor electrode and the second compensation capacitor electrode of the compensation capacitor for each row of pixel units in the row direction is negatively related to the number of sub-pixels of the row of pixel units.

For example, the compensation resistor includes a compensation conductive wire. Each of a plurality of scanning signal lead wires used to provide the scanning signal to the n rows of pixel units is electrically connected to a respective compensation conductive wire, and a resistance value of the compensation conductive wire for each row of pixel units is negatively related to the number of sub-pixels of the row of pixel units. For the at least n rows of pixel units, a length of the compensation conductive wire for each row of pixel units is negatively related to the number of sub-pixels contained in the row of pixel units, and/or a wire diameter of the compensation conductive wire for each row of pixel units is positively related to the number of sub-pixels contained in the row of pixel units.

In the display substrate provided by the embodiments of the present disclosure, the less the number of sub-pixels connected to the scanning signal line corresponding to the load compensation unit, the greater the compensation load value of the load compensation unit. The scanning signal lines corresponding to different numbers of sub-pixels are compensated by load compensation units having different compensation load values, so that the loads on the different scanning signal lines may be uniform, which may avoid a display difference and ensure a display quality.

Referring back to FIG. 1, the display substrate according to some exemplary embodiments of the present disclosure may include: a driver chip 110 arranged on the base substrate 100 and located in the bezel area NA, where the driver chip 110 is used to output the scanning signal; and a plurality of scanning signal lead wires GLY arranged on the base substrate 100 and located in the bezel area NA, where the plurality of scanning signal lead wires GLY are electrically connected to the plurality of scanning signal lines GL respectively. For example, the driver chip 110 may be a gate driver chip used to provide a gate scanning signal. Accordingly, the scanning signal line GL is a gate line, and the scanning signal lead wire GLY is a gate lead wire. In such embodiments, the scanning signal lead wire GLY is electrically connected between the driver chip 110 and the scanning signal line GL, and is used to provide the scanning signal generated by the driver chip 110 to the scanning signal line GL. The scanning signal line GL then transmits the scanning signal to each sub-pixel in a row of pixel units electrically connected to the scanning signal line GL. In such embodiments, the scanning signal lead wire GLY is in a fanout region, that is, the scanning signal lead wire GLY is a fanout region wire.

Figure 4A:
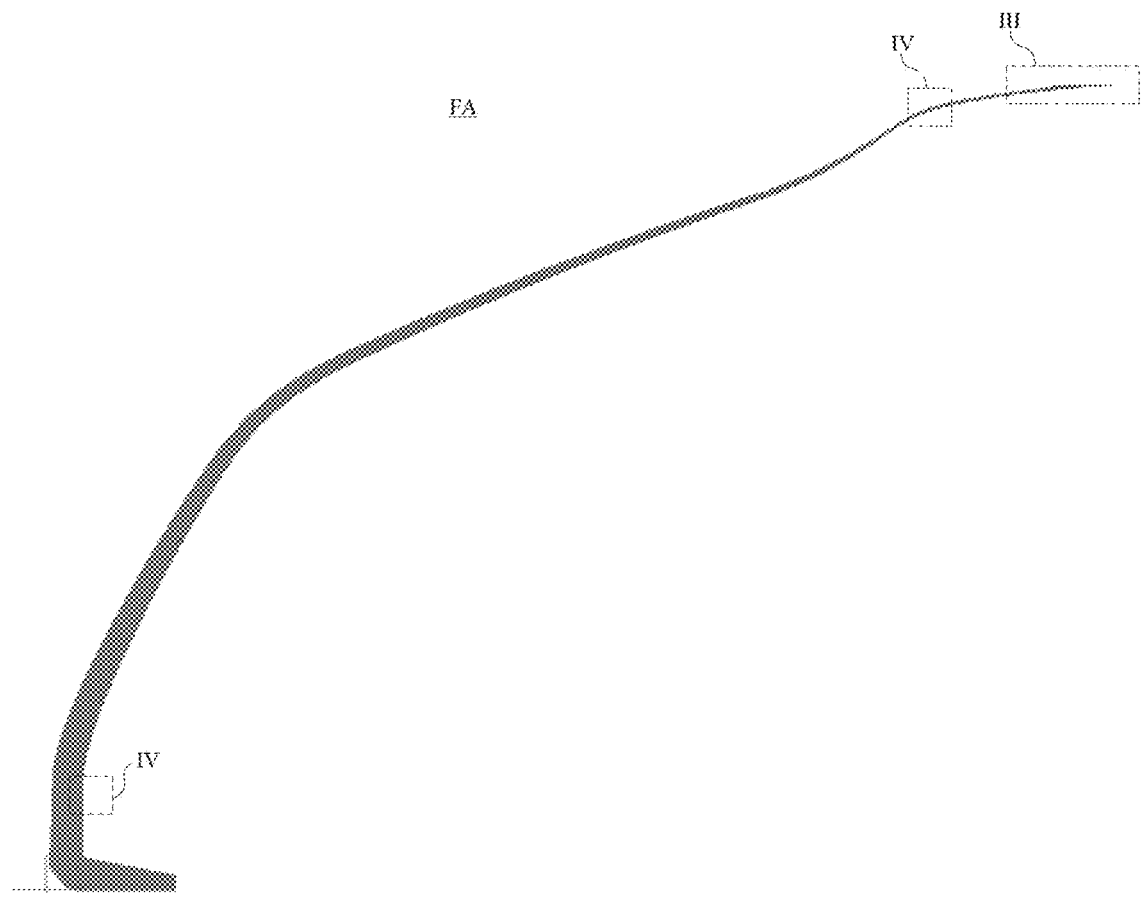
FIG. 4A shows a schematic diagram of a fanout region of a display substrate according to some exemplary embodiments of the present disclosure.
Figure 4B:
FIG. 4B to FIG. 4D respectively show partial enlarged views of the region III, the region IV and the region V in FIG. 4A.
Figure 4C:
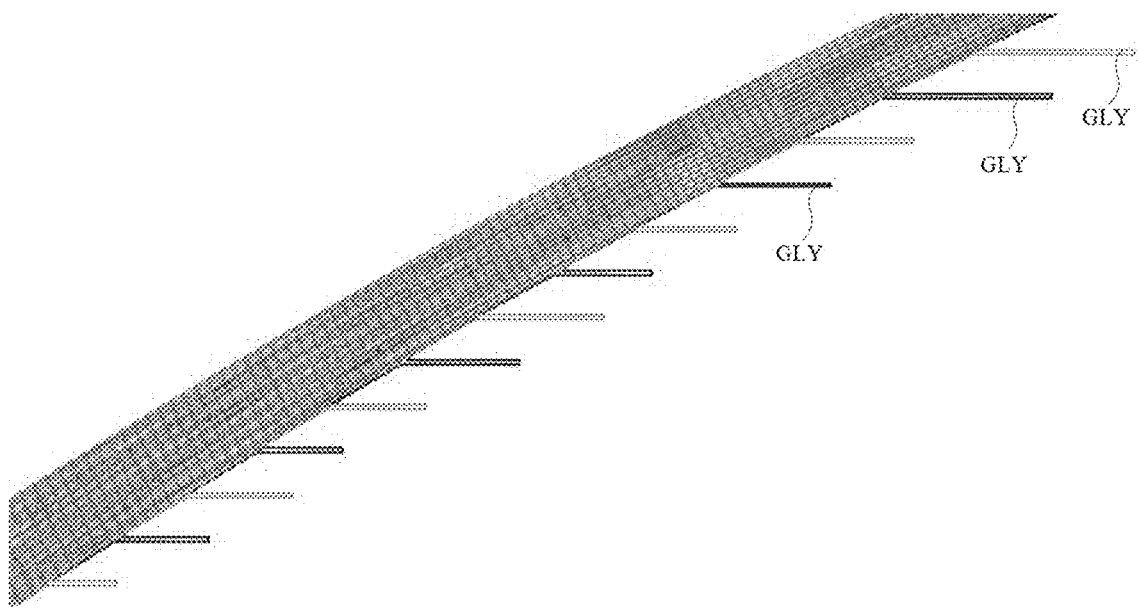
Figure 4D:
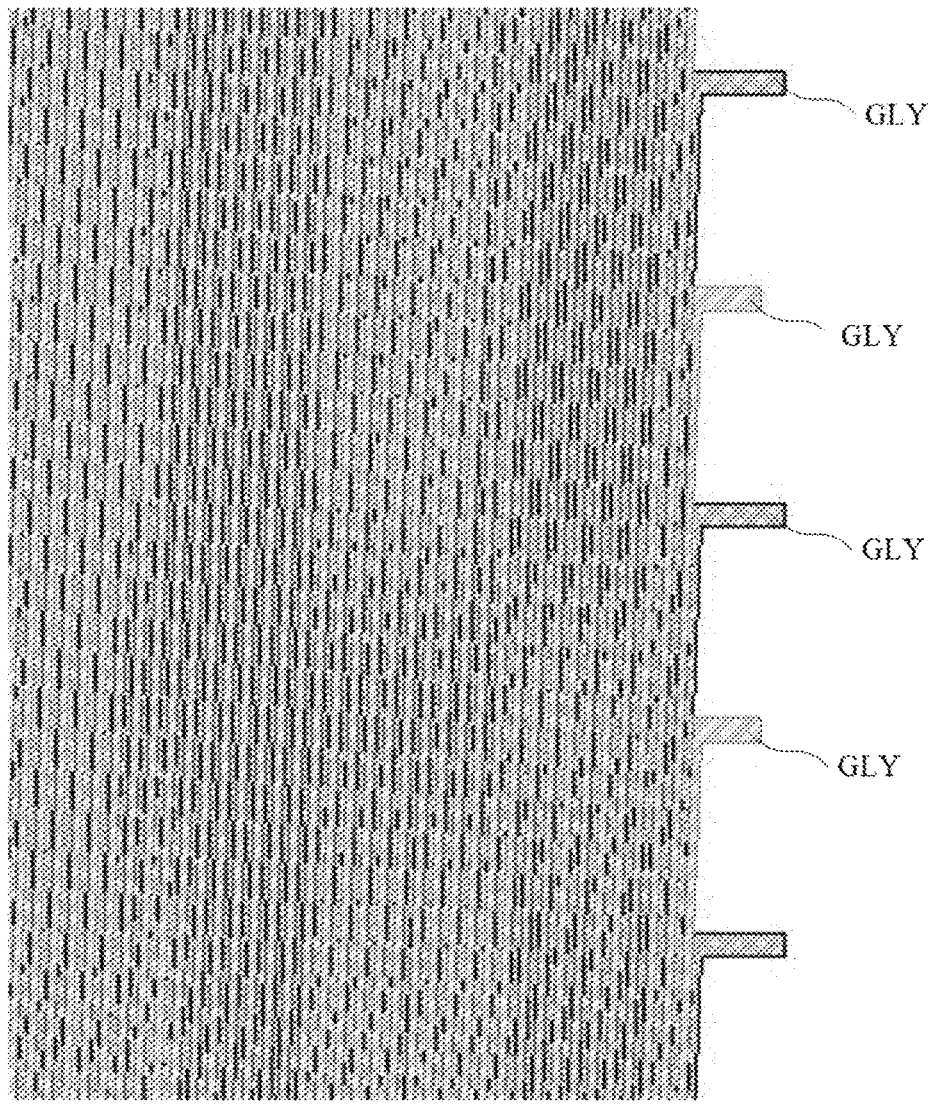

FIG. 4A shows a schematic diagram of a fanout region of a display substrate according to some exemplary embodiments of the present disclosure. FIG. 4B to FIG. 4D respectively show partial enlarged views of the region III, the region IV and the region V in FIG. 4A. As shown in FIG. 4A to FIG. 4D, the fanout region FA of the display substrate has a limited space, and a large number of scanning signal lead wires GLY are required to be arranged in the fanout region FA. In this case, in the fanout region FA, the scanning signal lead wires GLY adopts a double-layer wiring method. That is, the scanning signal lead wires GLY for two adjacent rows of pixel units may be arranged in two different conductive layers respectively, so as to facilitate the wiring in the fanout region FA.

For example, for an odd-numbered row of pixel units, the scanning signal lead wire GLY is located in the first conductive layer 10, and for an even-numbered row of pixel units, the scanning signal lead wire GLY is located in the second conductive layer 20. Optionally, for an odd-numbered row of pixel units, the scanning signal lead wire GLY is located in the second conductive layer 20, and for the even-numbered row of pixel units, the scanning signal lead wire GLY is located in the first conductive layer 10.

It should be noted that in other embodiments of the present disclosure, for example, in a case that the space in the fanout region FA is sufficient, a single-layer wiring method is adopted for the scanning signal lead wires GLY in the fanout region FA. For example, for the N rows of pixel units, each of the scanning signal lead wires GLY is located in the first conductive layer 10. Optionally, for the N rows of pixel units, each of the scanning signal lead wires GLY is located in the second conductive layer 20.

Figure 6:
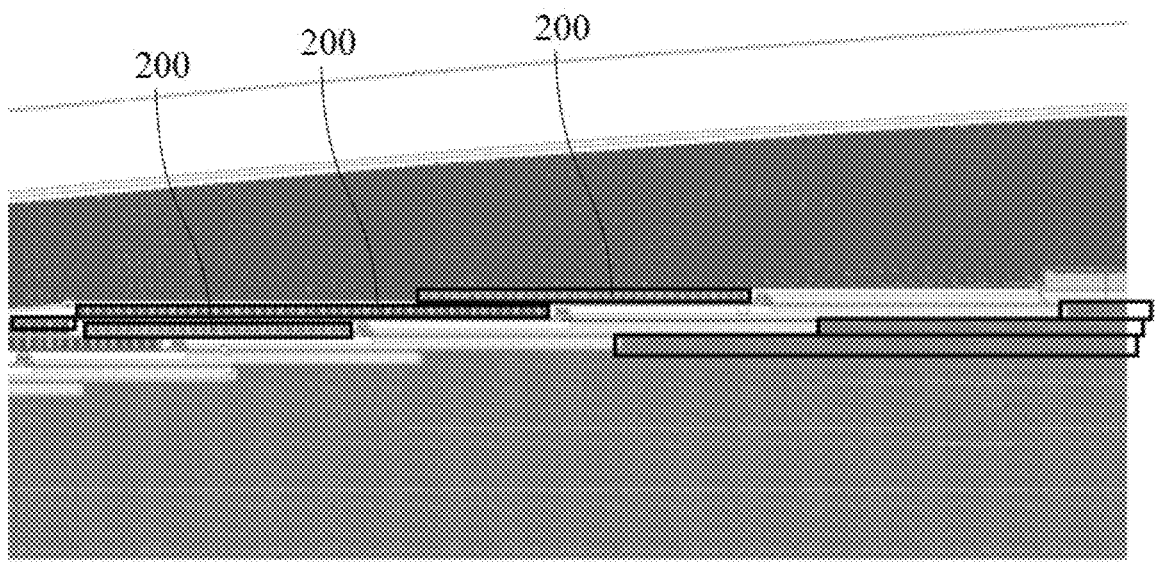
FIG. 6 shows a partial schematic diagram of a display substrate according to some exemplary embodiments of the present disclosure, in which load compensation units for some rows of pixel units are schematically shown.
Figure 7:
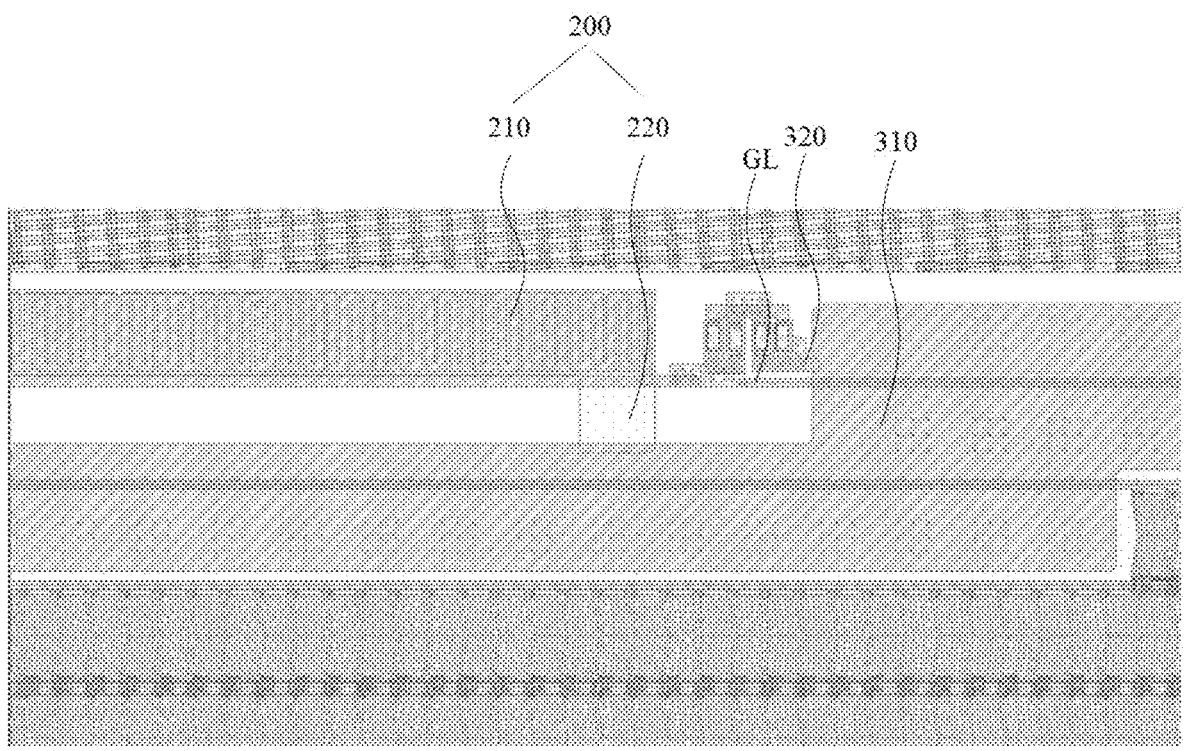
FIG. 7 shows a partial enlarged view of the display substrate shown in FIG. 6, in which a load compensation unit for an $i^{th}$ row of pixel units is schematically shown.
Figure 8:
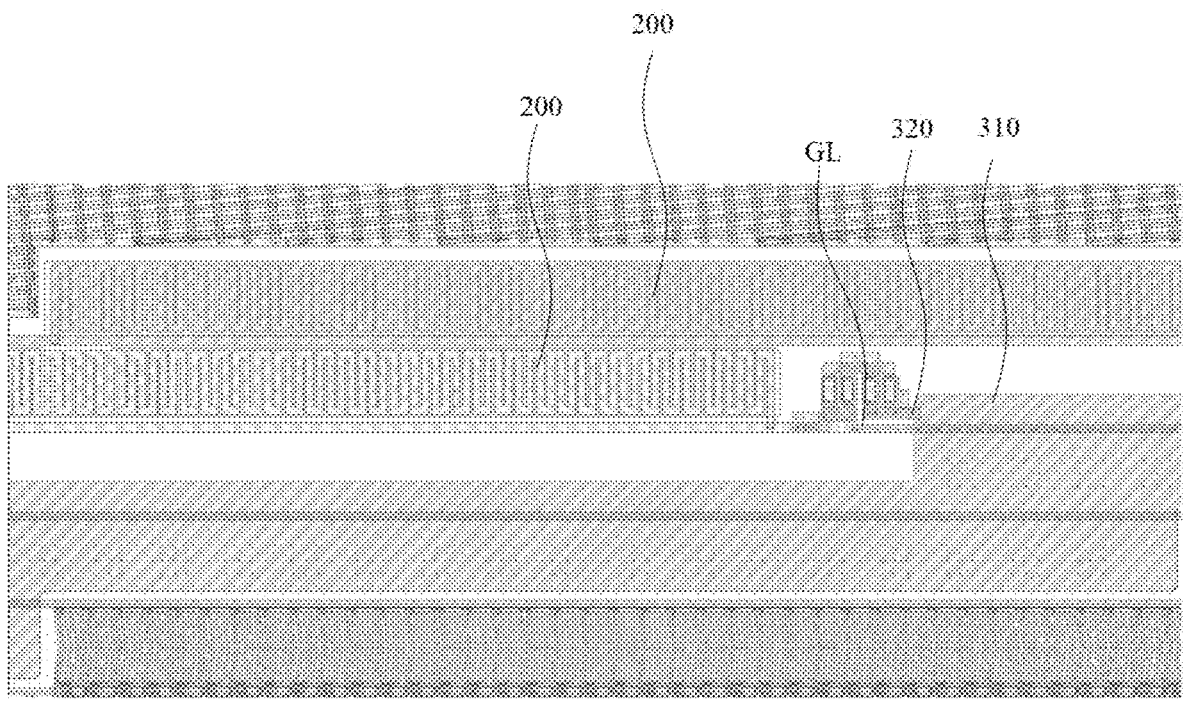
FIG. 8 shows a partial enlarged view of the display substrate shown in FIG. 6, in which a load compensation unit for an $(i+1)^{th}$ row of pixel units is schematically shown.
Figure 9:
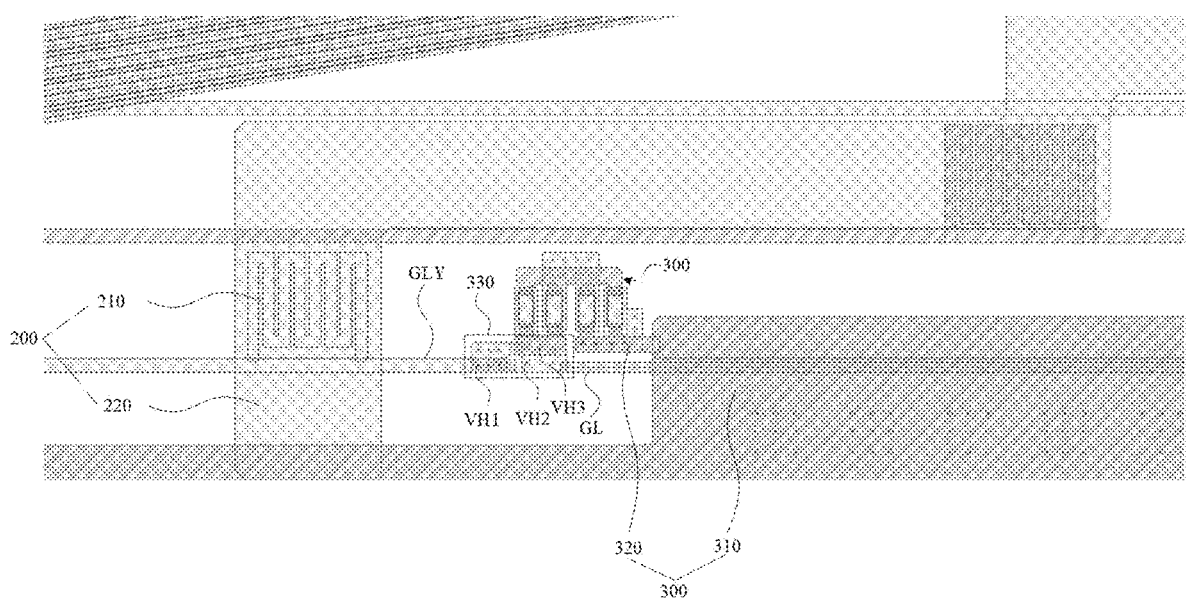
FIG. 9 shows a partial schematic diagram of a display substrate according to some exemplary embodiments of the present disclosure, in which a plan view of compensation capacitors and electrostatic discharge protection circuits for two rows of pixel units is schematically shown.
Figure 10:
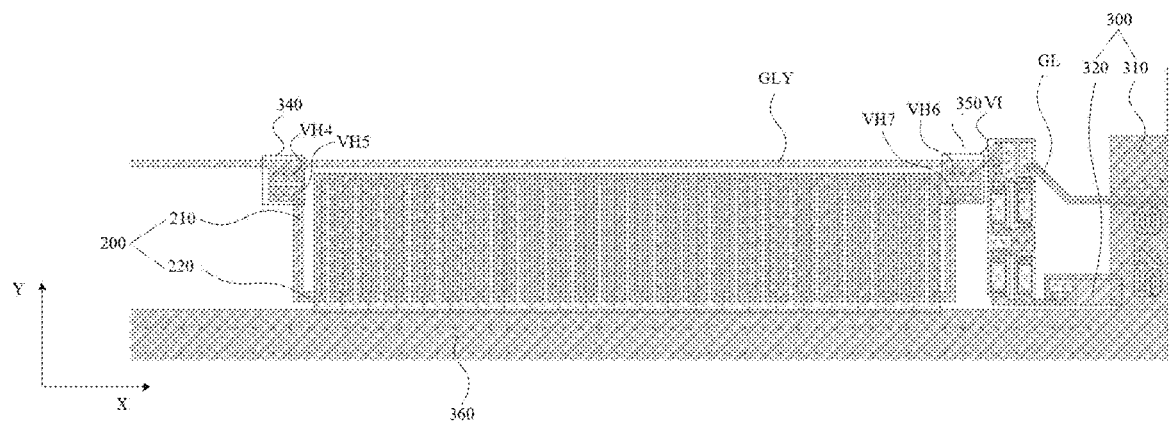
FIG. 10 shows a partial schematic diagram of a display substrate according to some exemplary embodiments of the present disclosure, in which a plan view of a compensation capacitor, an electrostatic discharge protection circuit and an electrostatic discharge protection structure for a row of pixel units is schematically shown.
Figure 11:
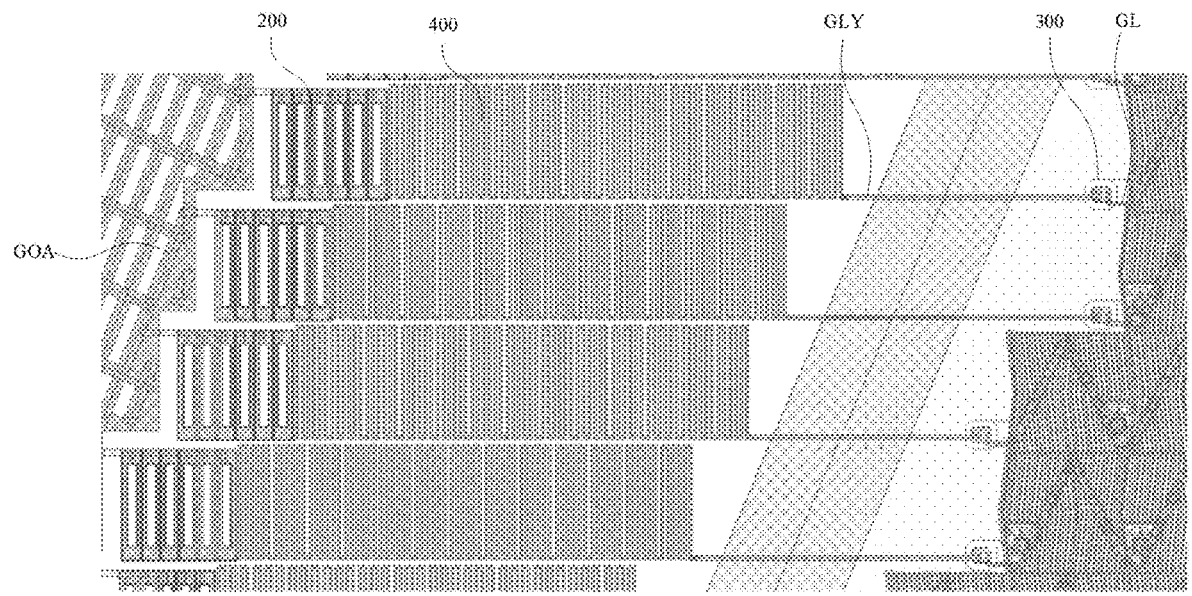
FIG. 11 shows a partial schematic diagram of a display substrate according to some exemplary embodiments of the present disclosure, in which a plan view of compensation capacitors and compensation resistors for some rows of pixel units is schematically shown.
Figure 13A:
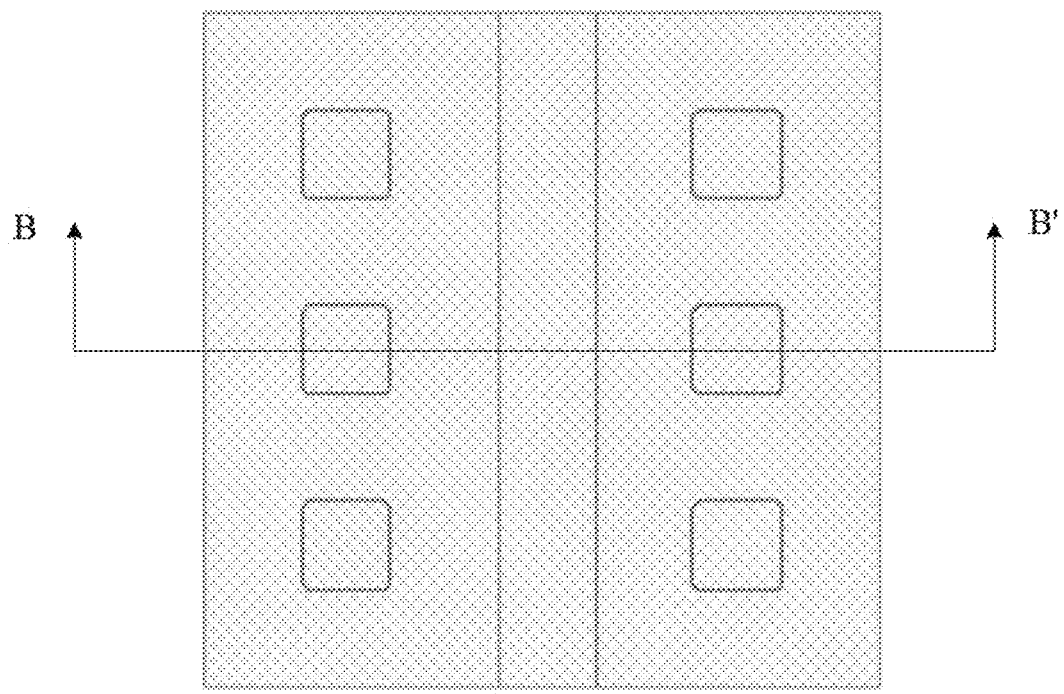
FIG. 13A shows a partial enlarged view of the display substrate at the region VI in FIG. 10, according to some exemplary embodiments of the present disclosure.
Figure 13B:
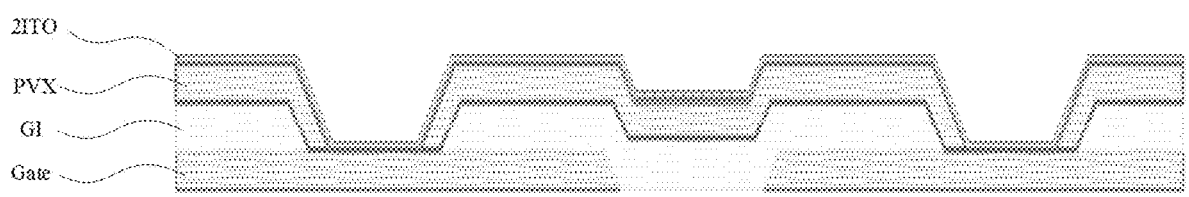
FIG. 13B shows a sectional view taken along the line BB' in FIG. 13A.
Figure 14A:
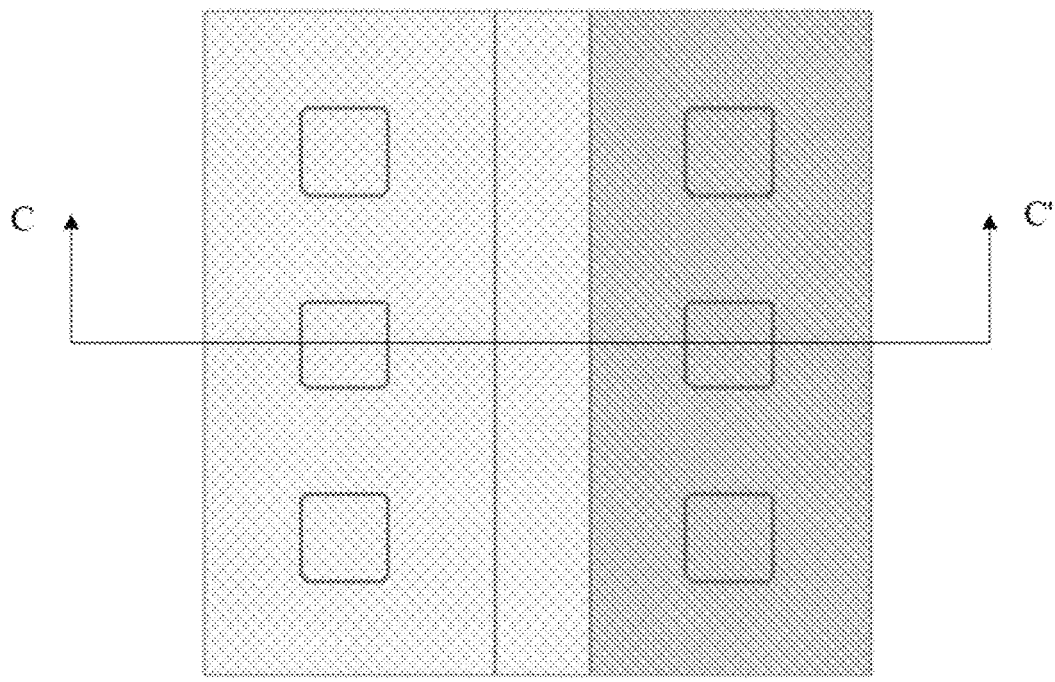
FIG. 14A shows a partial enlarged view of the display substrate at the region VI in FIG. 10, according to other exemplary embodiments of the present disclosure.
Figure 14B:
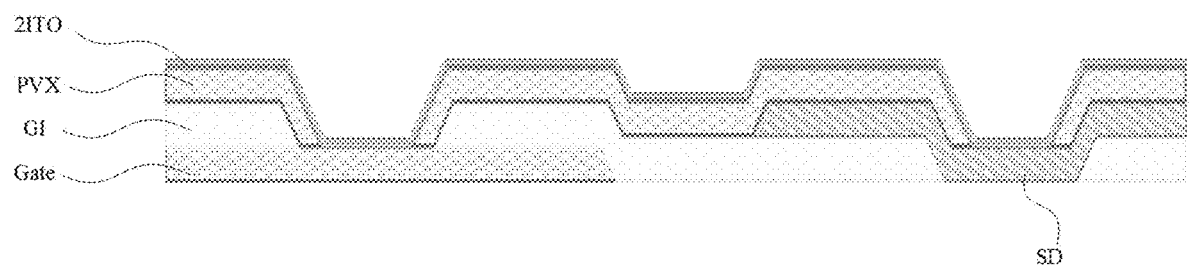
FIG. 14B shows a sectional view taken along the line CC' in FIG. 14A.
Figure 15A:
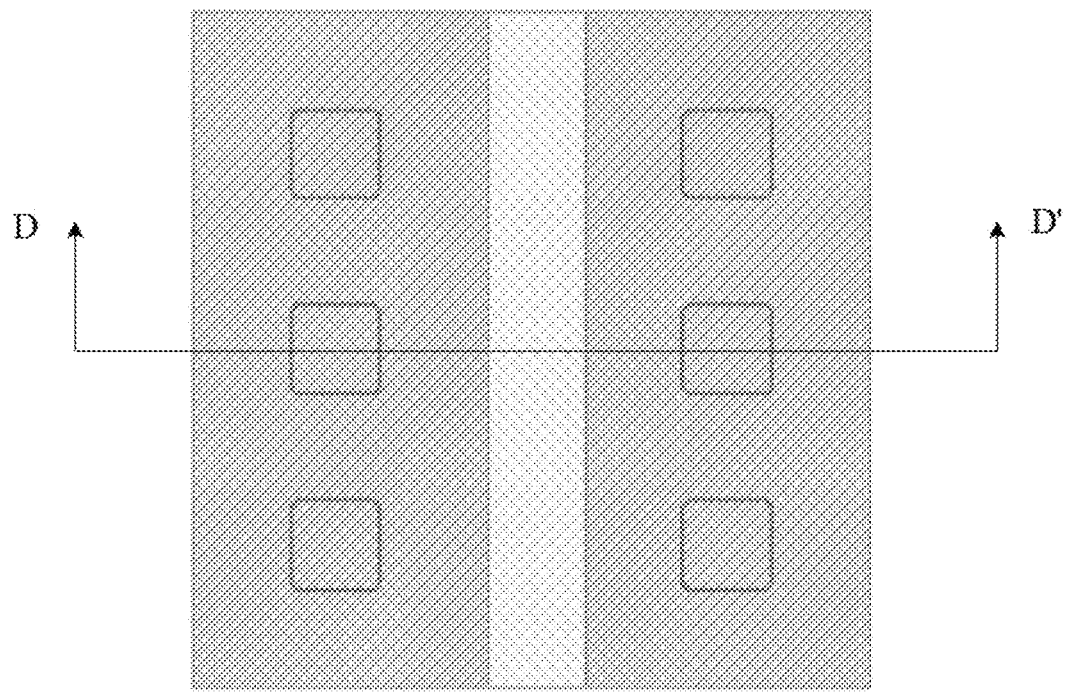
FIG. 15A shows a partial enlarged view of the display substrate at the region VI in FIG. 10, according to some exemplary embodiments of the present disclosure.
Figure 15B:
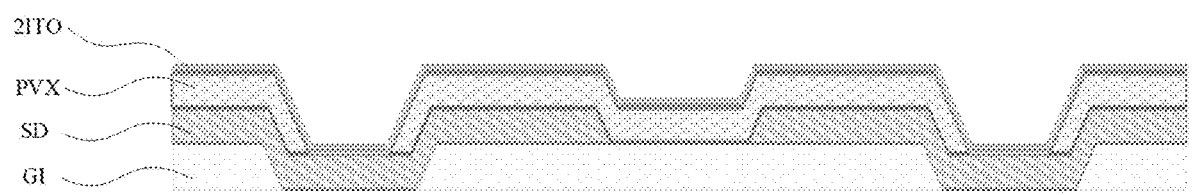
FIG. 15B shows a sectional view taken along the line DD' in FIG. 15A.

FIG. 6 shows a partial schematic diagram of a display substrate according to some exemplary embodiments of the present disclosure, in which load compensation units for some rows of pixel units are schematically shown. FIG. 7 shows a partial enlarged view of the display substrate shown in FIG. 6, in which a load compensation unit for an $i^{th}$ row of pixel units is schematically shown. FIG. 8 shows a partial enlarged view of the display substrate shown in FIG. 6, in which a load compensation unit for an $(i+1)^{th}$ row of pixel units is schematically shown. FIG. 9 shows a partial schematic diagram of a display substrate according to some exemplary embodiments of the present disclosure, in which a plan view of compensation capacitors and electrostatic discharge protection circuits for two rows of pixel units is schematically shown. FIG. 10 shows a partial schematic diagram of a display substrate according to some exemplary embodiments of the present disclosure, in which a plan view of a compensation capacitor, an electrostatic discharge protection circuit and an electrostatic discharge protection structure for a row of pixel units is schematically shown. FIG. 11 shows a partial schematic diagram of a display substrate according to some exemplary embodiments of the present disclosure, in which a plan view of compensation capacitors and compensation resistors for some rows of pixel units is schematically shown. FIG. 12A to FIG. 12D schematically show schematic sectional views of a compensation capacitor of a display substrate according to some exemplary embodiments of the present disclosure. FIG. 13A shows a partial enlarged view of the display substrate at the region VI in FIG. 10, according to some exemplary embodiments of the present disclosure. FIG. 13B shows a sectional view taken along line BB' in FIG. 13A. FIG. 14A shows a partial enlarged view of the display substrate at the region VI in FIG. 10, according to other exemplary embodiments of the present disclosure. FIG. 14B shows a sectional view taken along the line CC' in FIG. 14A. FIG. 15A shows a partial enlarged view of the display substrate at the region VI in FIG. 10, according to some exemplary embodiments of the present disclosure. FIG. 15B shows a sectional view taken along the line DD' in FIG. 15A.

In the embodiments of the present disclosure, as described above, the double-layer wiring method may be adopted for the scanning signal lead wires GLY. As shown in FIG. 7, the scanning signal lead wire GLY for the $i^{th}$ row of pixel units is in the second conductive layer 20. As shown in FIG. 8, the scanning signal lead wire GLY for the (i+1)$^{th}$ row of pixel units is in the first conductive layer 10.

In the embodiments of the present disclosure, the compensation capacitor 200 may include a first compensation capacitor electrode 210 and a second compensation capacitor electrode 220. The first compensating capacitor electrode 210 may be configured to receive the scanning signal, for example, a gate scanning signal. The second compensation capacitor electrode 220 may be configured to receive the common voltage signal.

For example, the first compensation capacitor electrode 210 may be connected to the gate scanning lead wire GLY. For another example, as shown in FIG. 7 to FIG. 9, the first compensation capacitor electrode 210 and the scanning signal lead wire GLY that are connected to each other may be formed into a continuously extending integral structure.

For example, the first compensation capacitor electrode 210 includes a plurality of zigzag wire segments extending from the scanning signal lead wire GLY. Optionally, the first compensation capacitor electrode 210 includes a first conductive portion extending from the scanning signal lead wire GLY, and the first conductive portion has a hollow structure. In the embodiments of the present disclosure, by connecting the first compensation capacitor electrode to the scanning signal lead wire, that is, the first compensation capacitor electrode is provided in the same layer as the scanning signal lead wire, it may be conducive to the formation of the first compensation capacitor electrode. Under the premise of ensuring a large conductive area, by forming the first compensation capacitor electrode as the plurality of zigzag wire segments or the conductive portion having the hollow structure, it is possible to prevent electrostatic charges from gathering on the first compensation capacitor electrode, which is conducive to electrostatic discharge protection.

As shown in FIG. 7, the display substrate may further include an electrostatic discharge protection ring 310 receiving the common voltage signal. The second compensation capacitor electrode 220 may be connected to the electrostatic discharge protection ring 310, so as to receive the common voltage signal. For example, the second compensation capacitor electrode 220 includes a second conductive portion 320 extending from the electrostatic discharge protection ring 310.

Referring to FIG. 9, the second conductive portions 320 of the compensation capacitors for the n rows of pixel units are formed into a continuously extending integral structure.

Referring to FIG. 10, for the n rows of pixel units, the second conductive portions 320 of the compensation capacitors for the n rows of pixel units extend from the electrostatic discharge protection ring 310 towards the display area AA respectively.

For any row of pixel units among the n rows of pixel units that require the load compensation, the compensation capacitor is connected to the scanning signal lead wire GLY for the row of pixel units. The first compensation capacitor electrode and the second compensation capacitor electrode of the compensation capacitor are respectively located in different conductive layers, and an orthographic projection of the first compensation capacitor electrode on the base substrate 100 at least partially overlaps with an orthographic projection of the second compensation capacitor electrode on the base substrate 100, and at least one insulation layer is provided between the first compensation capacitor electrode and the second compensation capacitor electrode, so as to form the capacitor structure.

Figure 12A:
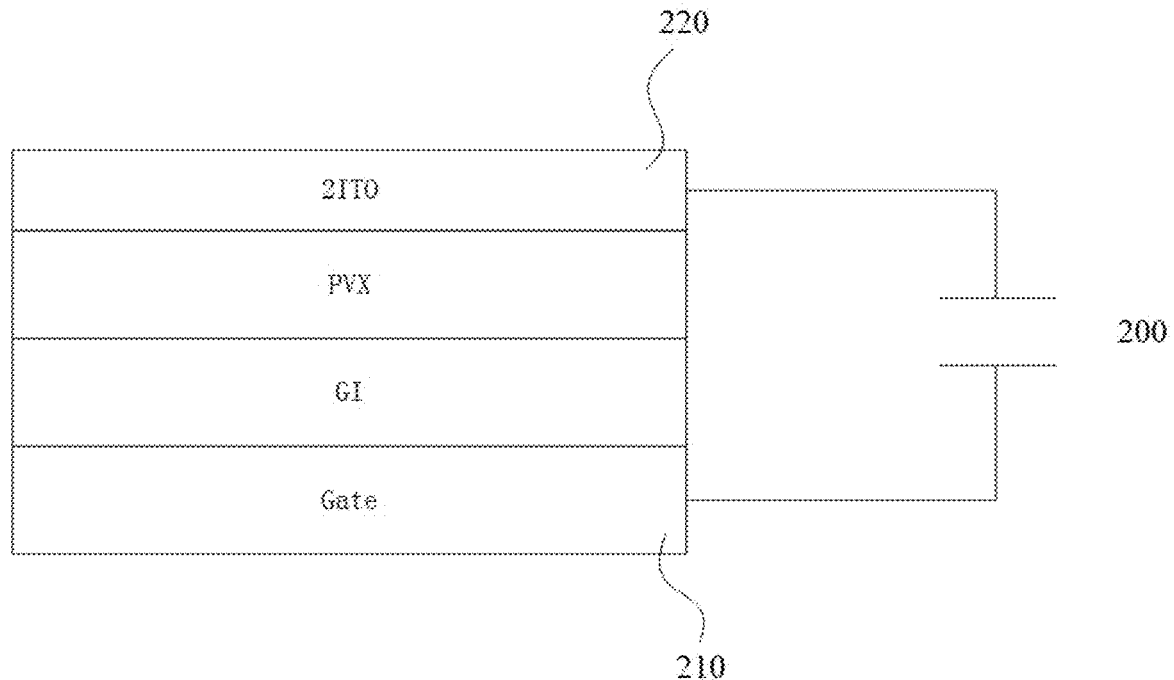
FIG. 12A to FIG. 12D schematically show schematic sectional views of a compensation capacitor of a display substrate according to some exemplary embodiments of the present disclosure.
Figure 12B:
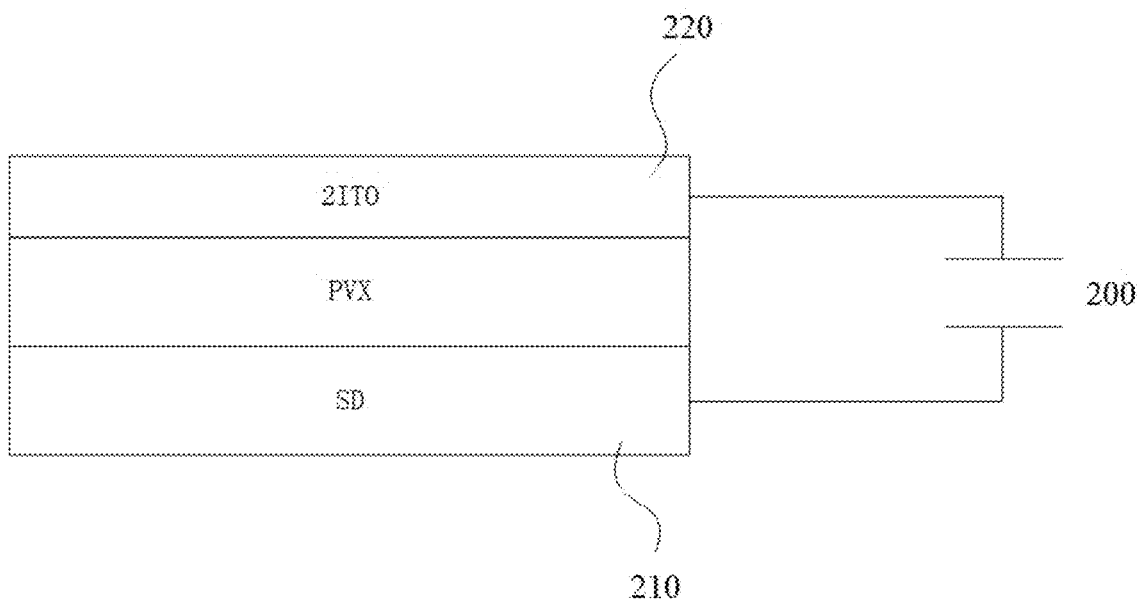

For example, for an odd-numbered row of pixel units, the first compensation capacitor electrode 210 and the scanning signal lead wire GLY are in the first conductive layer 10, as shown in FIG. 8, FIG. 9 and FIG. 12A. For an even-numbered row of pixel units, the first compensation capacitor electrode 210 and the scanning signal lead wire GLY are in the second conductive layer 20, as shown in FIG. 7, FIG. 9, FIG. 10 and FIG. 12B. For each the n rows of pixel units, the second compensation capacitor electrode 220 is in the third conductive layer 30, as shown in FIG. 7 to FIG. 10, FIG. 12A and FIG. 12B.

Optionally, for an odd-numbered row of pixel units, the first compensation capacitor electrode 210 and the scanning signal lead wire GLY are in the second conductive layer 20, as shown in FIG. 7, FIG. 9, FIG. 10 and FIG. 12B. For an even-numbered row of pixel units, the first compensation capacitor electrode 210 and the scanning signal lead wire GLY are in the first conductive layer 10, as shown in FIG. 8, FIG. 9 and FIG. 12A. For each of the n rows of pixel units, the second compensation capacitor electrode 220 is in the third conductive layer 30, as shown in FIG. 7 to FIG. 10, FIG. 12A and FIG. 12B.

Figure 12C:
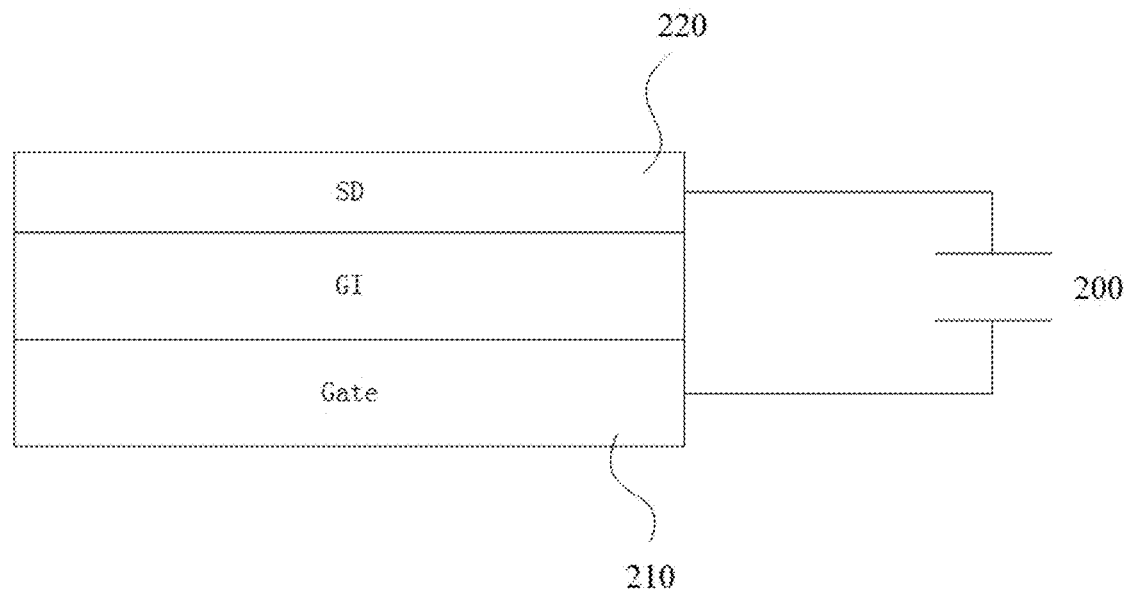

Optionally, for an odd-numbered row of pixel units, the first compensation capacitor electrode 210 and the scanning signal lead wire GLY are in the first conductive layer 10, as shown in FIG. 8, FIG. 9 and FIG. 12A, and the second compensation capacitor electrode 220 is in the second conductive layer 20 (as shown in FIG. 12C) or the third conductive layer 30. For an even-numbered row of pixel units, the first compensation capacitor electrode 210 and the scanning signal lead wire GLY are in the second conductive layer 20, as shown in FIG. 7, FIG. 9, FIG. 10 and FIG. 12B, and the second compensation capacitor electrode 220 is in the second conductive layer 20 (as shown in FIG. 12C) or the third conductive layer 30.

Optionally, for an odd-numbered row of pixel units, the first compensation capacitor electrode 210 and the scanning signal lead wire GLY are in the second conductive layer 20, as shown in FIG. 7, FIG. 9, FIG. 10 and FIG. 12B, and the second compensation capacitor electrode 220 is in the second conductive layer 20 (as shown in FIG. 12C) or the third conductive layer 30. For an even-numbered row of pixel units, the first compensation capacitor electrode 210 and the scanning signal lead wire GLY are in the first conductive layer 10, as shown in FIG. 8, FIG. 9 and FIG. 12A, and the second compensation capacitor electrode 220 is in the second conductive layer 20 (as shown in FIG. 12C) or the third conductive layer 30.

Optionally, both the first compensation capacitor electrode 210 and the scanning signal lead wire GLY are in the first conductive layer 10, and the second compensation capacitor electrode 220 is in the second conductive layer 20 or the third conductive layer 30.

Optionally, both the first compensation capacitor electrode 210 and the scanning signal lead wire GLY are in the second conductive layer 20, and the second compensation capacitor electrode 220 is in the first conductive layer 10 or the third conductive layer 30.

In other words, the first compensation capacitor electrode 210 and the scanning signal lead wire GLY for a same row of pixel units are connected to each other, and both the first compensation capacitor electrode 210 and the scanning signal lead wire GLY are in a same conductive layer selected from the first conductive layer 10 and the second conductive layer 20, and the second compensation capacitor electrode 220 is in another conductive layer different from the first compensation capacitor electrode 210.

According to some other exemplary embodiments of the present disclosure, the display substrate may adopt a GOA technology, i.e., Gate Driver on Array. According to the GOA technology, a driver circuit is directly arranged on the array substrate or display substrate, instead of an external driver chip. Each GOA unit acts as a stage of shift register, and each stage of shift register is connected to a scanning signal line. A plurality of stages of shift registers output turn-on voltages in sequence, so that a progressive scanning of pixels may be achieved. In some embodiments, each stage of shift register may also be connected to a plurality of scanning signal lines. In this way, it is possible to adapt to a development trend of high resolution and narrow bezel of the display substrate.

Referring to FIG. 11, the display substrate may include: a gate driver circuit 120 arranged on the base substrate 100 and located in the bezel area NA, where the gate driver circuit 120 is used to output the scanning signal; and a plurality of scanning signal lead wires GLY arranged on the base substrate 100 and located in the bezel area NA, where the plurality of scanning signal lead wires GLY are electrically connected to the plurality of scanning signal lines GL respectively. In such embodiments, the scanning signal lead wire GLY is electrically connected between the gate driver circuit 120 and the scanning signal line GL, so as to provide the scanning signal generated by the gate driver circuit 120 to the scanning signal line GL. The scanning signal line GL then transmits the scanning signal to each sub-pixel in a row of pixel units electrically connected to the scanning signal line GL. In such embodiments, it is not necessary to arrange the scanning signal lead wires GLY in the fanout region. In this case, the single-layer wiring method may be adopted for the scanning signal lead wires GLY.

For example, the first compensation capacitor electrode 210 and the scanning signal lead wire GLY are in the first conductive layer 10, and the second compensation capacitor electrode 220 is in the second conductive layer 20 or the third conductive layer 30.

Optionally, the first compensation capacitor electrode 210 and the scanning signal lead wire GLY are in the second conductive layer 20, and the second compensation capacitor electrode 220 is in the first conductive layer 10 or the third conductive layer 30.

Figure 12D:
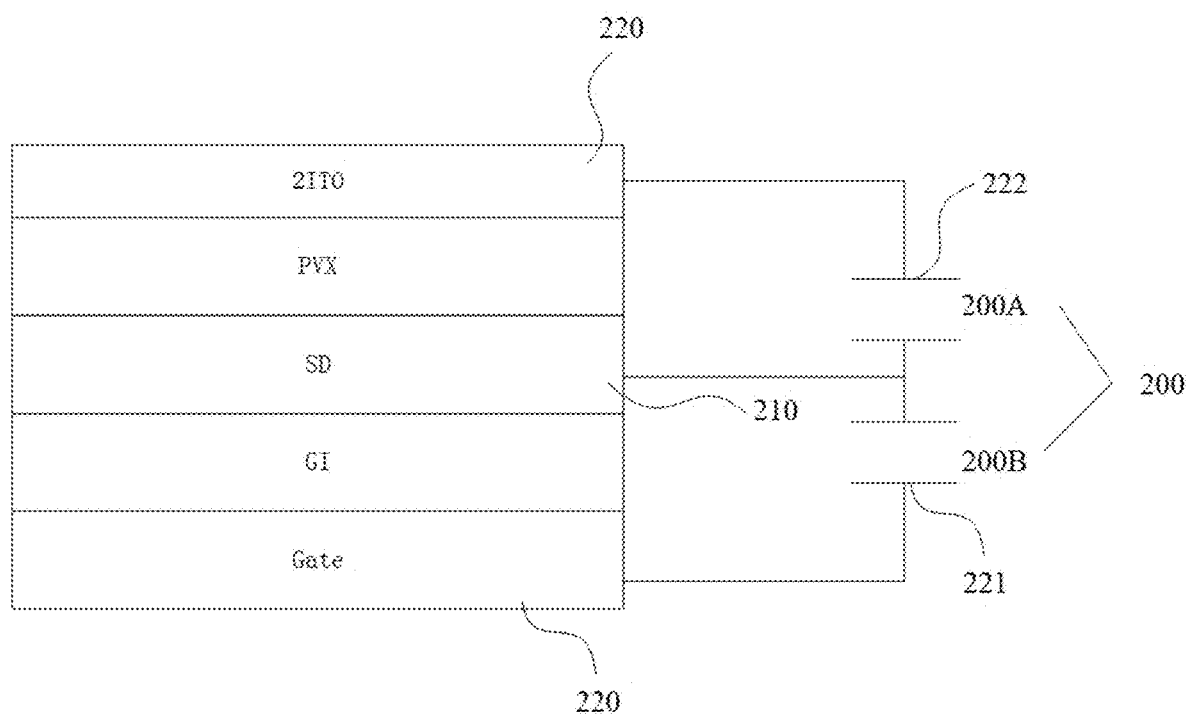

Referring to FIG. 12D, in some exemplary embodiments of the present disclosure, the compensation capacitor 200 may include a first sub compensation capacitor 200A and a second sub compensation capacitor 200B. The second compensation capacitor electrode 220 includes a first sub compensation capacitor electrode 221 and a second sub compensation capacitor electrode 222, and the first sub compensation capacitor electrode 221 and the second sub compensation capacitor electrode 222 are configured to receive the common voltage signal.

For example, the first compensation capacitor electrode 210 is in the second conductive layer 20, the first sub compensation capacitor electrode 221 is in the first conductive layer 10, and the second sub compensation capacitor electrode 222 is in the third conductive layer 30.

An orthographic projection of the first compensation capacitor electrode 210 on the base substrate at least partially overlaps with an orthographic projection of the first sub compensation capacitor electrode 221 on the base substrate, so as to form the first sub compensation capacitor electrode 200A.

The orthographic projection of the first compensation capacitor electrode 210 on the base substrate overlaps at least partially with an orthographic projection of the second sub compensation capacitor electrode 222 on the base substrate, so as to form the second sub compensation capacitor electrode 200B.

In such embodiments, the compensation capacitor includes two capacitors connected in parallel, which is beneficial to the increase of an area of the overlap between the first compensation capacitor electrode and the second compensation capacitor electrode, thereby increasing the capacitance value of the compensation capacitor. In this way, a compensation capacitor with a same capacitance value may be achieved while reducing a width of the bezel area occupied by the compensation capacitor, which helps achieve a narrow-bezel display apparatus.

In the embodiments of the present disclosure, the load compensation unit may include at least one of the compensation capacitor and the compensation resistor. For example, the load compensation unit may only include the above-mentioned compensation capacitor, the load compensation unit may only include the compensation resistor, or the load compensation unit may include both the compensation capacitor and the compensation resistor.

Referring to FIG. 10 and FIG. 11, a part of the scanning signal lead wire GLY is formed as a compensation resistor 400.

For example, at least a part of the scanning signal lead wire GLY used to provide the scanning signal to at least one row of pixel units includes a plurality of zigzag wire segments, and the compensation resistor 400 includes the plurality of zigzag wire segments. A length of the scanning signal lead wire GLY may be increased by such zigzag wiring mode, thereby increasing the resistance. In this way, the resistance compensation may be performed on the scanning signal lead wire.

Optionally, it is also possible to change a wire diameter of the scanning signal lead wire GLY, so as to perform the resistance compensation on the scanning signal lead wire.

Referring back to FIG. 11, the scanning signal lead wires GLY for two adjacent rows of pixel units extend in the row direction X, and the first compensation capacitor electrode 210 is between the scanning signal lead wires GLY for the two adjacent rows of pixel units in the column direction Y.

Referring to FIG. 7 to FIG. 11, the display substrate further includes an electrostatic discharge protection circuit 300. A terminal of the electrostatic discharge protection circuit 300 is electrically connected to the scanning signal lead wire GLY and the scanning signal line GL, and another terminal of the electrostatic discharge protection circuit 300 is electrically connected to the electrostatic discharge protection ring 310 such that static electricity on the scanning signal lead wire GLY and static electricity on the scanning signal line GL are released to the electrostatic discharge protection ring 310.

Figure 18:
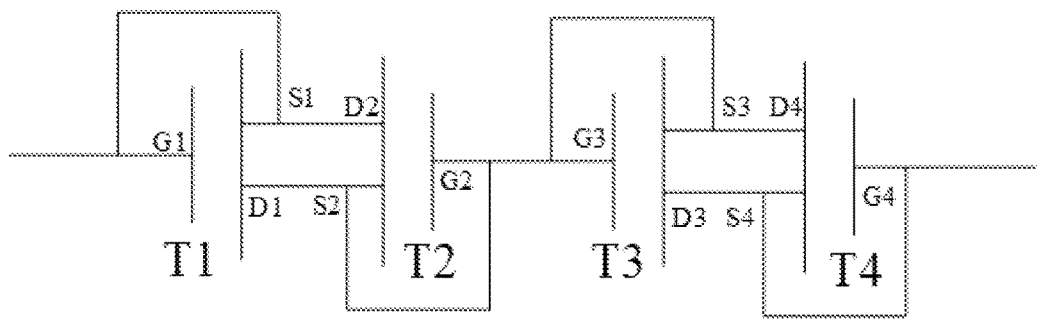
FIG. 18 shows an equivalent circuit diagram of an electrostatic discharge protection circuit according to some exemplary embodiments of the present disclosure.

FIG. 18 shows an equivalent circuit diagram of an electrostatic discharge protection circuit according to some exemplary embodiments of the present disclosure. Referring to FIG. 7 to FIG. 11 and FIG. 18, the electrostatic discharge protection circuit may include four thin film transistors. For example, the thin film transistors of the electrostatic discharge protection circuit may be formed simultaneously with the thin film transistors of the pixel driver circuit. A gate electrode G1 of a thin film transistor T1 is electrically connected to a source electrode S1 of the thin film transistor T1, so as to form a first outer lead wire of the electrostatic discharge protection circuit. For example, the first outer lead wire may be electrically connected to the scanning signal lead wire GLY and the scanning signal line GL. A drain electrode D2 of a thin film transistor T2 may be electrically connected to the source electrode S1 of the thin film transistor T1. Similarly, a gate electrode G2 of the thin film transistor T2 is electrically connected to a source electrode S2 of the thin film transistor T2. A drain electrode D1 of the thin film transistor T1 is electrically connected to the source electrode S2 of the thin film transistor T2. A gate electrode G3 of a thin film transistor T3 is electrically connected to a source electrode S3 of the thin film transistor T3, and is electrically connected to the drain electrode D1 of the thin film transistor T1 and the gate electrode G2 of the thin film transistor T2. A drain electrode D4 of a thin film transistor T4 is electrically connected to the source electrode S3 of the thin film transistor T3. Similarly, a gate electrode G4 of the thin film transistor T4 is electrically connected to a source electrode S4 of the thin film transistor T4, so as to form a second outer lead wire of the electrostatic discharge protection circuit. For example, the second outer lead wire may be electrically connected to the electrostatic discharge protection ring 310. The drain electrode D3 of the thin film transistor T3 is electrically connected to the source electrode S4 of the thin film transistor T4.

In the embodiments of the present disclosure, when high-voltage static electricity is generated on a scanning signal lead wire GLY or a scanning signal line GL, the high voltage static electricity may be distributed to the electrostatic discharge protection ring 310 through the electrostatic discharge protection circuit 300, and then distributed to a common voltage signal bus through the electrostatic discharge protection ring 310, so that the high-voltage static electricity is distributed to the entire display substrate. In this way, it is possible to prevent the high-voltage static electricity from damaging a certain scanning signal lead wire GLY or scanning signal line GL.

As shown in FIG. 9, the display substrate further includes a first conductive transfer portion 330 in the third conductive layer 30. An end of the scanning signal lead wire GLY proximate to the display area AA is electrically connected to a first part of the first conductive transfer portion 330 through a first via hole VH1. An end of the scanning signal line GL away from the display area AA is electrically connected to a second part of the first conductive transfer portion 330 through a second via hole VH2. A third part of the first conductive transfer portion 330 is electrically connected to a terminal of the electrostatic discharge protection circuit 300 through a third via hole VH3.

Optionally, the display substrate may further include an electrostatic discharge protection structure for the compensation capacitor. Referring to FIG. 10, the display substrate further includes a second conductive transfer portion 340 in the third conductive layer 30. A part of the scanning signal lead wire GLY is electrically connected to a part of the second conductive transfer portion 340 through a fourth via hole VH4, and another part of the second conductive transfer portion 340 is electrically connected to an end of the first compensation capacitor electrode 210 through a fifth via hole VH5.

The display substrate further includes a third conductive transfer portion 350 in the third conductive layer 30. Another part of the scanning signal lead wire GLY is electrically connected to a part of the third conductive transfer portion 350 through a sixth via hole VH6, and another part of the third conductive transfer portion 350 is electrically connected to another end of the first compensation capacitor electrode 210 through a seventh via hole VH7.

For example, referring to FIG. 13A and FIG. 13B, the scanning signal lead wire GLY may be in the first conductive layer 10, the first compensation capacitor electrode 210 may be in the first conductive layer 10, and the second conductive transfer portion 340 may be in the third conductive layer 30. At least two insulation layers are provided between the first conductive layer 10 and the third conductive layer 30. In this case, each of the fourth via hole VH4, the fifth via hole VH5, the sixth via hole VH6, and the seventh via hole VH7 penetrates the at least two insulation layers. The scanning signal lead wire GLY in the first conductive layer 10 is electrically connected to the second conductive transfer portion 340 in the third conductive layer 30 through the fourth via hole VH4, and the first compensation capacitor electrode 210 in the first conductive layer 10 is electrically connected to the second conductive transfer portion 340 in the third conductive layer 30 through the fifth via hole VH5. Through such conductive transfer structure, the scanning signal lead wire GLY is electrically connected to the first compensation capacitor electrode 210. Such transfer layer design may reduce a continuous extension length of conductive wires of a same kind, so that an electrostatic burning may be prevented.

For example, referring to FIG. 14A and FIG. 14B, the scanning signal lead wire GLY may be in the first conductive layer 10, the first compensation capacitor electrode 210 may be in the second conductive layer 20, and the second conductive transfer portion 340 may be in the third conductive layer 30. At least one insulation layer is provided between the first conductive layer 10 and the second conductive layer 20. At least two insulation layers are provided between the first conductive layer 10 and the third conductive layer 30. In this case, each of the fourth via hole VH4 and the sixth via hole VH6 penetrates the at least two insulation layers, and each of the fifth via hole VH5 and the seventh via hole VH7 penetrates the at least one insulation layer. The scanning signal lead wire GLY in the first conductive layer 10 is electrically connected to the second conductive transfer portion 340 in the third conductive layer 30 through the fourth via hole VH4, and the first compensation capacitor electrode 210 in the second conductive layer 20 is electrically connected to the second conductive transfer portion 340 in the third conductive layer 30 through the fifth via hole VH5. Through such conductive transfer structure, the scanning signal lead wire GLY is electrically connected to the first compensation capacitor electrode 210. Such transfer layer design may reduce a continuous extension length of conductive wires of a same kind, so that an electrostatic burning may be prevented.

For example, referring to FIG. 15A and FIG. 15B, the scanning signal lead wire GLY may be in the second conductive layer 20, the first compensation capacitor electrode 210 may be in the second conductive layer 20, and the second conductive transfer portion 340 may be in the third conductive layer 30. At least one insulation layer is provided between the second conductive layer 20 and the third conductive layer 30. In this case, each of the fourth via hole VH4, the fifth via hole VH5, the sixth via hole VH6, and the seventh via hole VH7 penetrates the at least one insulation layer. The scanning signal lead wire GLY in the second conductive layer 20 is electrically connected to the second conductive transfer portion 340 in the third conductive layer 30 through the fourth via hole VH4, and the first compensation capacitor electrode 210 in the second conductive layer 20 is electrically connected to the second conductive transfer portion 340 in the third conductive layer 30 through the fifth via hole VH5. Through such conductive transfer structure, the scanning signal lead wire GLY is electrically connected to the first compensation capacitor electrode 210. Such layer change design may reduce a continuous extension length of conductive wires of a same kind, so that an electrostatic burning may be prevented.

Referring to FIG. 10, the display substrate includes a common voltage signal bus 360 for providing the common voltage signal. For the load compensation unit for at least one row of pixel units, the compensation capacitor 200 is on a side of the common voltage signal bus 360 proximate to the display area AA in the row direction X, the compensation resistor 400 is on a side of the compensation capacitor 200 proximate to the display area AA in the row direction X, and the electrostatic discharge protection circuit 300 is on a side of the compensation resistor 400 proximate to the display area AA.

At least some embodiments of the present disclosure further provide a display panel including the display substrate as described above. For example, the display panel may be a liquid crystal display panel.

At least some embodiments of the present disclosure further provide a display apparatus, and the display apparatus may include the display substrate as described above. The display apparatus includes a display area AA and a bezel area NA, and the bezel area NA has a small width, so that a display apparatus with a narrow bezel is achieved.

The display apparatus may include any apparatus or product having a display function. For example, the display apparatus may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo, or smart watch), a television, and so on.

It should be understood that the display apparatus according to the embodiments of the present disclosure has all features and advantages of the display substrate described above. The details may be referred to the above description and will not be repeated here.

Although some embodiments of a general technical concept of the present disclosure have been illustrated and described, it should be understood by those ordinary skilled in the art that changes may be made to these embodiments without departing from the principle and spirit of the general technical concept of the present disclosure. The scope of the present disclosure is defined by the claims and their equivalents.

What is claimed is:

1. A display substrate, comprising:
   a base substrate, comprising a display area and a bezel area on at least one side of the display area;
   a plurality of pixel units in the display area, wherein the plurality of pixel units are arranged on the base substrate in an array in a row direction and a column direction, and each row of pixel units comprises a plurality of sub-pixels;
   a plurality of scanning signal lines arranged on the base substrate and configured to provide a scanning signal to a plurality of rows of sub-pixels respectively;
   a plurality of load compensation units arranged on the base substrate and located in the bezel area, wherein the plurality of load compensation units are electrically connected to at least some of the plurality of scanning signal lines respectively; and
   a common electrode arranged on the base substrate, wherein at least part of the common electrode is in the display area, and the common electrode is configured to receive a common voltage signal,
   wherein at least one of the plurality of load compensation units comprises at least one of a compensation capacitor and a compensation resistor;
   wherein the display substrate comprises N rows of pixel units, and n rows of pixel units among the N rows of pixel units comprise different numbers of sub-pixels, wherein N is a positive integer greater than or equal to 2, and n is a positive integer greater than or equal to 2 and less than or equal to N; and
   wherein the scanning signal line for each of the n rows of pixel units is electrically connected to a respective load compensation unit, a load compensation value of the load compensation unit for each row of pixel units is negatively related to the number of sub-pixels of the row of pixel units, and the load compensation value comprises at least one of a capacitance compensation value and a resistance compensation value.

2. The display substrate according to claim 1, wherein the compensation capacitor comprises a first compensation capacitor electrode and a second compensation capacitor electrode, wherein the first compensation capacitor electrode is electrically connected to the scanning signal line, the second compensation capacitor electrode is configured to receive the common voltage signal, and an orthographic projection of the first compensation capacitor electrode on the base substrate at least partially overlaps with an orthographic projection of the second compensation capacitor electrode on the base substrate.

3. The display substrate according to claim 2, wherein each of a plurality of scanning signal lead wires configured to provide the scanning signal to the n rows of pixel units is electrically connected to a respective compensation capacitor, and an area of the overlap between the first compensation capacitor electrode and the second compensation capacitor electrode of the compensation capacitor for each row of pixel units is negatively related to the number of sub-pixels of the row of pixel units.

4. The display substrate according to claim 3, wherein a size of at least one of the first compensation capacitor electrode of the compensation capacitor for each row of pixel units in the row direction is negatively related to the number of sub-pixels of the row of pixel units.

5. The display substrate according to claim 2, wherein the first compensation capacitor electrode and the scanning signal lead wire that are connected to each other are formed into a continuously extending integral structure;
   wherein the first compensation capacitor electrode comprises a plurality of zigzag wire segments extending from the scanning signal lead wire; or the first compensation capacitor electrode comprises a first conductive portion extending from the scanning signal lead wire, and the first conductive portion has a hollow structure; and
   wherein each of the scanning signal lead wires for two adjacent rows of pixel units extends in the row direction, and in the column direction, the first compensation capacitor electrode is between the scanning signal lead wires for the two adjacent rows of pixel units.

6. The display substrate according to claim 2, wherein the display substrate comprises an electrostatic discharge protection ring receiving the common voltage signal; and the second compensation capacitor electrode comprises a second conductive portion extending from the electrostatic discharge protection ring; and wherein the second conductive portions of the compensation capacitors for the n rows of pixel units are formed into a continuously extending integral structure; or the second conductive portions of the compensation capacitors for the n rows of pixel units extend from the electrostatic discharge protection ring towards the display area respectively.

7. The display substrate according to claim 2, wherein the display substrate further comprises an electrostatic discharge protection circuit, a terminal of the electrostatic discharge protection circuit is electrically connected to each of the scanning signal lead wire and the scanning signal line, and another terminal of the electrostatic discharge protection circuit is electrically connected to an electrostatic discharge protection ring such that static electricity on the scanning signal lead wire and static electricity on the scanning signal line are released to the electrostatic discharge protection ring.

8. The display substrate according to claim 7, wherein the display substrate further comprises a first conductive transfer portion in the third conductive layer; and an end of the scanning signal lead wire proximate to the display area is electrically connected to a first part of the first conductive transfer portion through a first via hole, an end of the scanning signal line away from the display area is electrically connected to a second part of the first conductive transfer portion through a second via hole, and a third part of the first conductive transfer portion is electrically connected to a terminal of the electrostatic discharge protection circuit through a third via hole;
  wherein the display substrate further comprises a second conductive transfer portion in the third conductive layer; a part of the scanning signal lead wire is electrically connected to a part of the second conductive transfer portion through a fourth via hole, and another part of the second conductive transfer portion is electrically connected to an end of the first compensation capacitor electrode through a fifth via hole; and/or the display substrate further comprises a third conductive transfer portion in the third conductive layer; another part of the scanning signal lead wire is electrically connected to a part of the third conductive transfer portion through a sixth via hole, and another part of the third conductive transfer portion is electrically connected to another end of the first compensation capacitor electrode through a seventh via hole; and
  wherein the display substrate comprises a common voltage signal bus for providing the common voltage signal; and for the load compensation unit for at least one row of pixel units, the compensation capacitor is on a side of the common voltage signal bus proximate to the display area in the row direction, the compensation resistor is on a side of the compensation capacitor proximate to the display area in the row direction, and the electrostatic discharge protection circuit is on a side of the compensation resistor proximate to the display area.

9. The display substrate according to claim 1, wherein the compensation resistor comprises a compensation conductive wire; and
  each of a plurality of scanning signal lead wires configured to provide the scanning signal to the n rows of pixel units is electrically connected to a respective compensation conductive wire, and a resistance value of the compensation conductive wire for each row of pixel units is negatively related to the number of sub-pixels of the row of pixel units.

10. The display substrate according to claim 9, wherein for the at least n rows of pixel units, a length of the compensation conductive wire for each row of pixel units is negatively related to the number of sub-pixels of the row of pixel units, and/or a wire diameter of the compensation conductive wire for each row of pixel units is positively related to the number of sub-pixels of the row of pixel units.

11. The display substrate according to claim 9, wherein a part of the scanning signal lead wire is formed as the compensation resistor;
  wherein at least part of the scanning signal lead wire configured to provide the scanning signal to at least one row of pixel units comprises a plurality of zigzag wire segments, and the compensation resistor comprises the plurality of zigzag wire segments; and
  wherein a difference between overall loads on the scanning signal lines for two adjacent rows of pixel units is within a specified threshold, wherein the overall load comprises a product of a capacitance load and a resistance load on the scanning signal line.

12. The display substrate according to claim 1, wherein the display substrate further comprises:
  a gate driver circuit arranged on the base substrate and located in the bezel area, wherein the gate driver circuit is configured to output the scanning signal; and
  a plurality of scanning signal lead wires arranged on the base substrate and located in the bezel area, wherein the plurality of scanning signal lead wires are electrically connected to the plurality of scanning signal lines respectively,
  wherein the display substrate comprises: a first conductive layer on the base substrate; a second conductive layer on a side of the first conductive layer away from the base substrate; and a third conductive layer on a side of the second conductive layer away from the base substrate, and
  wherein the first compensation capacitor electrode and the scanning signal lead wire for a same row of pixel units are connected to each other, and the first compensation capacitor electrode and the scanning signal lead wire for the same row of pixel units are in a same conductive layer selected from the first conductive layer and the second conductive layer.

13. The display substrate according to claim 12,
  wherein the first compensation capacitor electrode and the scanning signal lead wire are in the first conductive layer, and the second compensation capacitor electrode is in the second conductive layer or the third conductive layer; or
  wherein the first compensation capacitor electrode and the scanning signal lead wire are in the second conductive layer, and the second compensation capacitor electrode is in the first conductive layer or the third conductive layer.

14. The display substrate according to claim 12, wherein the compensation capacitor comprises a first sub compensation capacitor and a second sub compensation capacitor, the second compensation capacitor electrode comprises a first sub compensation capacitor electrode and a second sub compensation capacitor electrode, and the first sub compensation capacitor electrode and the second sub compensation capacitor electrode are configured to receive the common voltage signal, wherein
  the first compensation capacitor electrode is in the second conductive layer, the first sub compensation capacitor electrode is in the first conductive layer, and the second sub compensation capacitor electrode is in the third conductive layer;

an orthographic projection of the first compensation capacitor electrode on the base substrate at least partially overlaps with an orthographic projection of the first sub compensation capacitor electrode on the base substrate, so as to form the first sub compensation capacitor electrode; and the orthographic projection of the first compensation capacitor electrode on the base substrate at least partially overlaps with an orthographic projection of the second sub compensation capacitor electrode on the base substrate, so as to form the second sub compensation capacitor electrode.

15. The display substrate according to claim 1, wherein the display substrate further comprises:

a driver chip arranged on the base substrate and located in the bezel area, wherein the driver chip is configured to output the scanning signal; and a plurality of scanning signal lead wires arranged on the base substrate and located in the bezel area, wherein the plurality of scanning signal lead wires are electrically connected to the plurality of scanning signal lines respectively, wherein the display substrate comprises: a first conductive layer on the base substrate; a second conductive layer on a side of the first conductive layer away from the base substrate; and a third conductive layer on a side of the second conductive layer away from the base substrate; and wherein the first compensation capacitor electrode and the scanning signal lead wire for a same row of pixel units are connected to each other, and the first compensation capacitor electrode and the scanning signal lead wire for the same row of pixel units are in a same conductive layer selected from the first conductive layer and the second conductive layer.

16. The display substrate according to claim 15, wherein for an odd-numbered row of pixel units, the first compensation capacitor electrode and the scanning signal lead wire are in the first conductive layer; for an even-numbered row of pixel units, the first compensation capacitor electrode and the scanning signal lead wire are in the second conductive layer; and the second compensation capacitor electrode for each of the n rows of pixel units is in the third conductive layer; or for an odd-numbered row of pixel units, the first compensation capacitor electrode and the scanning signal lead wire are in the second conductive layer; for an even-numbered row of pixel units, the first compensation capacitor electrode and the scanning signal lead wire are in the first conductive layer; and the second compensation capacitor electrode for each of the n rows of pixel units are located in the third conductive layer.

17. The display substrate according to claim 15, wherein for an odd-numbered row of pixel units, the first compensation capacitor electrode and the scanning signal lead wire are in the first conductive layer, and the second compensation capacitor electrode is in the second conductive layer or the third conductive layer; and for an even-numbered row of pixel units, the first compensation capacitor electrode and the scanning signal lead wire are in the second conductive layer, and the second compensation capacitor electrode is in the first conductive layer or the third conductive layer; or wherein for an odd-numbered row of pixel units, the first compensation capacitor electrode and the scanning signal lead wire are in the second conductive layer, and the second compensation capacitor electrode is in the first conductive layer or the third conductive layer; for an even-numbered row of pixel units, the first compensation capacitor electrode and the scanning signal lead wire are in the first conductive layer, and the second compensation capacitor electrode is in the second conductive layer or the third conductive layer.

18. A display apparatus, comprising the display substrate according to claim 1.

19. A load compensation method applied to a display substrate, wherein the display substrate comprises: a base substrate comprising a display area and a bezel area on at least one side of the display area; a plurality of pixel units in the display area, wherein the plurality of pixel units are arranged on the base substrate in an array in a row direction and a column direction, and each row of pixel units comprises a plurality of sub-pixels; a plurality of scanning signal lines arranged on the base substrate, configured to provide a scanning signal to a plurality of rows of sub-pixels respectively; a plurality of load compensation units arranged on the base substrate and located in the bezel area, wherein the plurality of load compensation units are electrically connected to at least some of the plurality of scanning signal lines respectively; and a common electrode arranged on the base substrate, wherein at least part of the common electrode is in the display area, and the common electrode is configured to receive a common voltage signal, wherein the display substrate comprises N rows of pixel units, and N is a positive integer greater than or equal to 2; and wherein the method comprises:

driving the display substrate to display a white picture;

acquiring a charging voltage for a $p^{th}$ row of pixel units and a charging voltage for a $q^{th}$ row of pixel units, wherein the $p^{th}$ row of pixel units is a row of pixel units with a minimum number of sub-pixels among the N rows of pixel units, and the $q^{th}$ row of pixel units is a row of pixel units with a maximum number of sub-pixels among the N rows of pixel units;

calculating a difference between the charging voltage for the $p^{th}$ row of pixel units and the charging voltage for the $q^{th}$ row of pixel units;

comparing the difference between the charging voltages with a specified voltage threshold;

determining, in response to the difference between the charging voltages being greater than the specified voltage threshold, that load compensation is required to be performed;

determining, in response to the load compensation being required, n rows of pixel units that require the load compensation, where n is a positive integer greater than or equal to 2 and less than or equal to N, wherein a difference between the charging voltage for each row of pixel units among the n rows of pixel units and the charging voltage for the $q^{th}$ row of pixel units is greater than the specified threshold; and determining a load compensation value of the load compensation unit according to the number of sub-pixels of each row of pixel units among the n rows of pixel units and the number of sub-pixels of the $q^{th}$ row of pixel units, wherein each of a plurality of scanning signal lines configured to provide the scanning signal to the n rows of pixel units is electrically connected to a respective load compensation unit, a load compensation value for each of the n rows of pixel units is negatively related to the number of the sub-pixels of the row of pixel units, and the load compensation value comprises at least one of a capacitance compensation value and a resistance compensation value.

20. A load compensation method applied to a display substrate, wherein the display substrate comprises: a base substrate comprising a display area and a bezel area on at least one side of the display area; a plurality of pixel units in the display area, wherein the plurality of pixel units are arranged on the base substrate in an array in a row direction and a column direction, and each row of pixel units comprises a plurality of sub-pixels; a plurality of scanning signal lines arranged on the base substrate, configured to provide a scanning signal to a plurality of rows of sub-pixels respectively; a plurality of load compensation units arranged on the base substrate and located in the bezel area, wherein the plurality of load compensation units are electrically connected to at least some of the plurality of scanning signal lines respectively; and a common electrode arranged on the base substrate, wherein at least part of the common electrode is in the display area, and the common electrode is configured to receive a common voltage signal, wherein the display substrate comprises N rows of pixel units, and N is a positive integer greater than or equal to 2; and wherein the method comprises:

calculating a load difference between any two adjacent rows of pixel units;

comparing the load difference with a specified load difference threshold;

determining, in response to the load difference being greater than the specified load difference, n rows of pixel units that require load compensation, n being a positive integer greater than or equal to 2 and less than or equal to N, wherein the load difference between each row of pixel units among the n rows of pixel units and an adjacent row of pixel units is greater than the specified load difference threshold; and determining a load compensation value of the load compensation unit according to a number of sub-pixels of each row of pixel units among the n rows of pixel units and a number of sub-pixels of a $q^{th}$ row of pixel units, wherein the $q^{th}$ row of pixel units is a row of pixel units with a maximum number of sub-pixels among the N rows of pixel units, each of a plurality of scanning signal lines configured to provide the scanning signal to the n rows of pixel units is electrically connected to a respective load compensation unit, a load compensation value for each of the n rows of pixel units is negatively related to the number of the sub-pixels of the row of pixel units, and the load compensation value comprises at least one of a capacitance compensation value and a resistance compensation value.

* * * * *